United States Patent
Ross et al.

(10) Patent No.: US 11,032,948 B1
(45) Date of Patent: Jun. 8, 2021

(54) PRE-FABRICATED MECHANICAL AND ELECTRICAL DISTRIBUTION INFRASTRUCTURE SYSTEM

(71) Applicant: Amazon Technologies, Inc., Seattle, WA (US)

(72) Inventors: Peter Ross, Olympia, WA (US); Robert David Wilding, Seattle, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 16/443,655

(22) Filed: Jun. 17, 2019

(51) Int. Cl.
  *H05K 7/20* (2006.01)
  *H05K 7/14* (2006.01)

(52) U.S. Cl.
  CPC ....... *H05K 7/20572* (2013.01); *H05K 7/1492* (2013.01); *H05K 7/20836* (2013.01)

(58) Field of Classification Search
  CPC ............ H05K 7/20572; H05K 7/1492; H05K 7/20836
  USPC ........................................ 361/675, 691, 695
  See application file for complete search history.

(56) References Cited

U.S. PATENT DOCUMENTS

| | | | |
|---|---|---|---|
| 9,357,681 B2 | 5/2016 | Ross et al. | |
| 9,485,887 B1 * | 11/2016 | Eichelberg | H05K 7/1497 |
| 9,537,291 B1 * | 1/2017 | Wilding | H05K 7/20836 |
| 9,585,282 B1 | 2/2017 | Gandhi et al. | |
| 9,661,778 B1 * | 5/2017 | Ross | E04H 5/00 |
| 9,760,098 B1 | 9/2017 | Imwalle et al. | |
| 9,857,855 B2 * | 1/2018 | Kaplan | H05K 7/1492 |
| 9,888,614 B1 | 2/2018 | Ross et al. | |
| 9,983,248 B1 * | 5/2018 | Ramirez | H04B 3/00 |
| 10,271,462 B1 | 4/2019 | Ross et al. | |
| 2005/0241802 A1 | 11/2005 | Malone et al. | |
| 2008/0126699 A1 | 5/2008 | Sangapu et al. | |
| 2008/0144375 A1 | 6/2008 | Cheng | |
| 2009/0138313 A1 | 5/2009 | Morgan et al. | |
| 2009/0296342 A1 | 12/2009 | Matteson et al. | |
| 2011/0213735 A1 | 9/2011 | Cao et al. | |
| 2013/0149954 A1 * | 6/2013 | North | H05K 7/20745 454/184 |
| 2013/0190899 A1 | 7/2013 | Slessman et al. | |
| 2013/0201618 A1 * | 8/2013 | Czamara | H05K 7/20736 361/679.5 |
| 2013/0232888 A1 | 9/2013 | Crosby | |
| 2013/0233532 A1 | 9/2013 | Imwalle et al. | |
| 2014/0059945 A1 | 3/2014 | Gardner et al. | |

(Continued)

OTHER PUBLICATIONS

U.S. Appl. No. 16/368,713, filed Mar. 3, 2019, Mayankant Madhavkant.

(Continued)

*Primary Examiner* — Stephen S Sul
(74) *Attorney, Agent, or Firm* — Robert C. Kowert; Kowert, Hood, Munyon, Rankin & Goetzel, P.C.

(57) ABSTRACT

A pre-fabricated mechanical and electrical distribution infrastructure system comprises pre-fabricated panels that are connected together to form an air plenum for air distribution system at a data center location. The pre-fabricated panels include other infrastructure systems pre-assembled to the panels such that installation of the panels to form the air plenum also installs the other infrastructure systems, such as power distribution busways, building management sensors, lighting, etc.

22 Claims, 14 Drawing Sheets

(56) References Cited

U.S. PATENT DOCUMENTS

| | | | | |
|---|---|---|---|---|
| 2014/0133092 A1* | 5/2014 | Leckelt | ............... | H05K 7/1497 361/679.48 |
| 2015/0319878 A1* | 11/2015 | Morales | ............. | H05K 7/20709 361/679.46 |
| 2015/0342094 A1* | 11/2015 | Ross | ................. | H05K 7/20145 361/679.46 |
| 2017/0127569 A1* | 5/2017 | Rimler | ..................... | F16L 3/26 |
| 2018/0024608 A1* | 1/2018 | Kaplan | .................... | H02B 1/22 713/300 |
| 2019/0166723 A1* | 5/2019 | Long | ................. | H05K 7/20745 |

OTHER PUBLICATIONS

U.S. Appl. No. 16/218,328, filed Dec. 12, 2018, Peter George Ross et al.
U.S. Appl. No. 16/368,713, filed Mar. 28, 2019, Mayankant Madhavkant.
U.S. Appl. No. 16/112,501, filed Aug. 24, 2018, Osvaldo P. Morales et al.
Dave Cole, "The Information Source for the Data Center Industry Data Center Knowledge Guide to Data Center Infrastructure Management {DCIM) Data Center Knowledge Guide to DCIM", May 2012, Downloaded rom https://connect.ufl.edu/cns/DCO/dcim/White%20Papers/1_19292_DCK_Guide_to_DCIM_Final.pdf, pp. 1-19.
"Curse You, UCS", Douglas Alger, Cisco Biogs, Jun. 1, 2011, pp. 1-3.
"Design for a Productive Data Center", Douglas Alger, Cisco, May 2007, pp. 1-2.
"Designing a Scalable Network Infrastructure", Dr. Nalheer Khasawneh, Rafa! A. Dasan, downloaded Apr. 28, 2014, pp. 1-31.

* cited by examiner

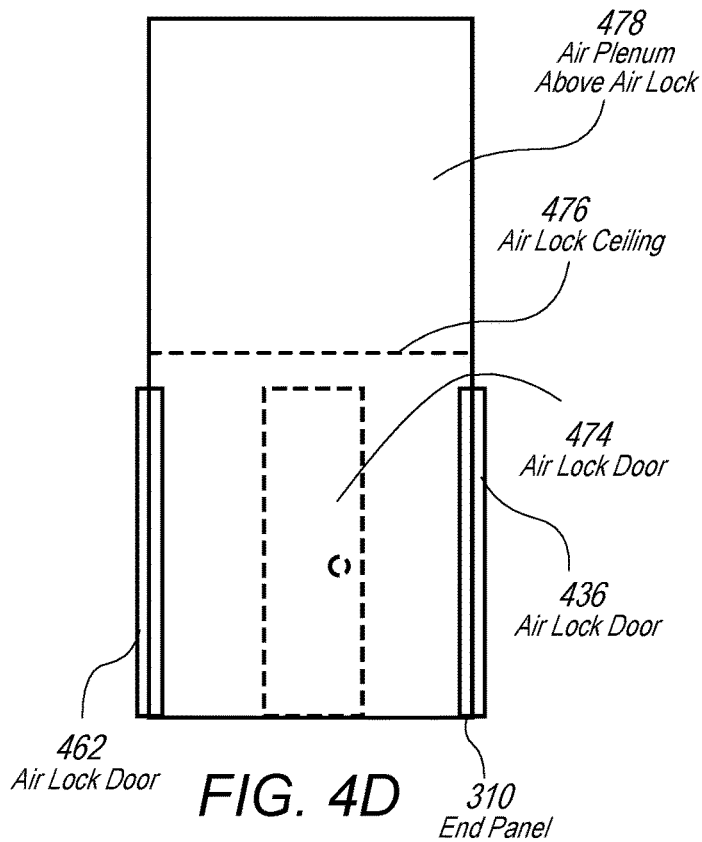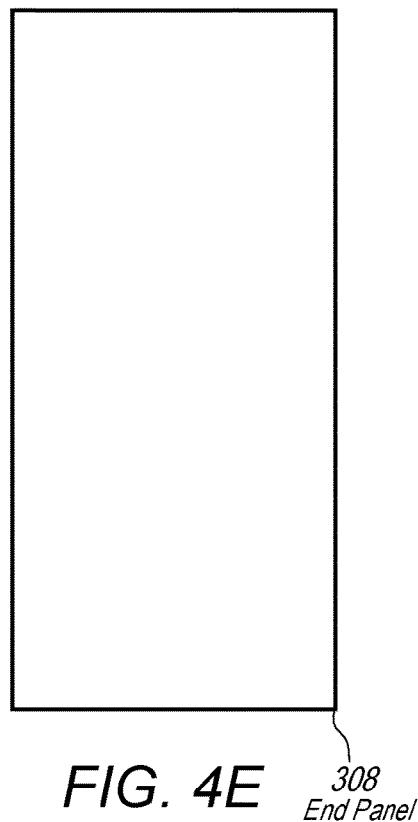
FIG. 4D
FIG. 4E

PRE-FABRICATED MECHANICAL AND ELECTRICAL DISTRIBUTION INFRASTRUCTURE SYSTEM

BACKGROUND

Organizations such as on-line retailers, Internet service providers, search providers, financial institutions, universities, and other computing-intensive organizations often conduct computer operations from large scale computing facilities. Also, such organizations, or smaller organizations, may outsource computer operations to a computing or storage service provider that operates large scale computing facilities. Such large scale computing facilities house and accommodate a large amount of server, network, and additional computer equipment to process, store, and exchange data. Typically, a computer room of a computing facility includes many server racks organized into rows with aisles between the rows of server racks. Each server rack, in turn, includes many servers and/or other associated computer equipment.

The amount of computing capacity needed for any given facility, such as a data center, may change rapidly as business needs dictate. Most often, there is a need for increased capacity at a data center location. Initially providing computing or storage capacity in a facility, such as a data center, or expanding the existing capacity of a facility (in the form of additional servers, for example), is resource-intensive and may take many months to implement. Substantial amounts of time and skilled labor are typically required to design and build data center infrastructure (or expand data center infrastructure). Often data center infrastructure is installed on-site, wherein data center infrastructure components are installed sequentially by different specialized crafts people.

BRIEF DESCRIPTION OF THE DRAWINGS

FIG. 4D illustrates an end view of a pre-fabricated end panel of a modular mechanical and electrical distribution infrastructure system, according to some embodiments.

FIG. 4E illustrates an end view of a pre-fabricated end panel of a modular mechanical and electrical distribution infrastructure system, according to some embodiments.

Figure 1:
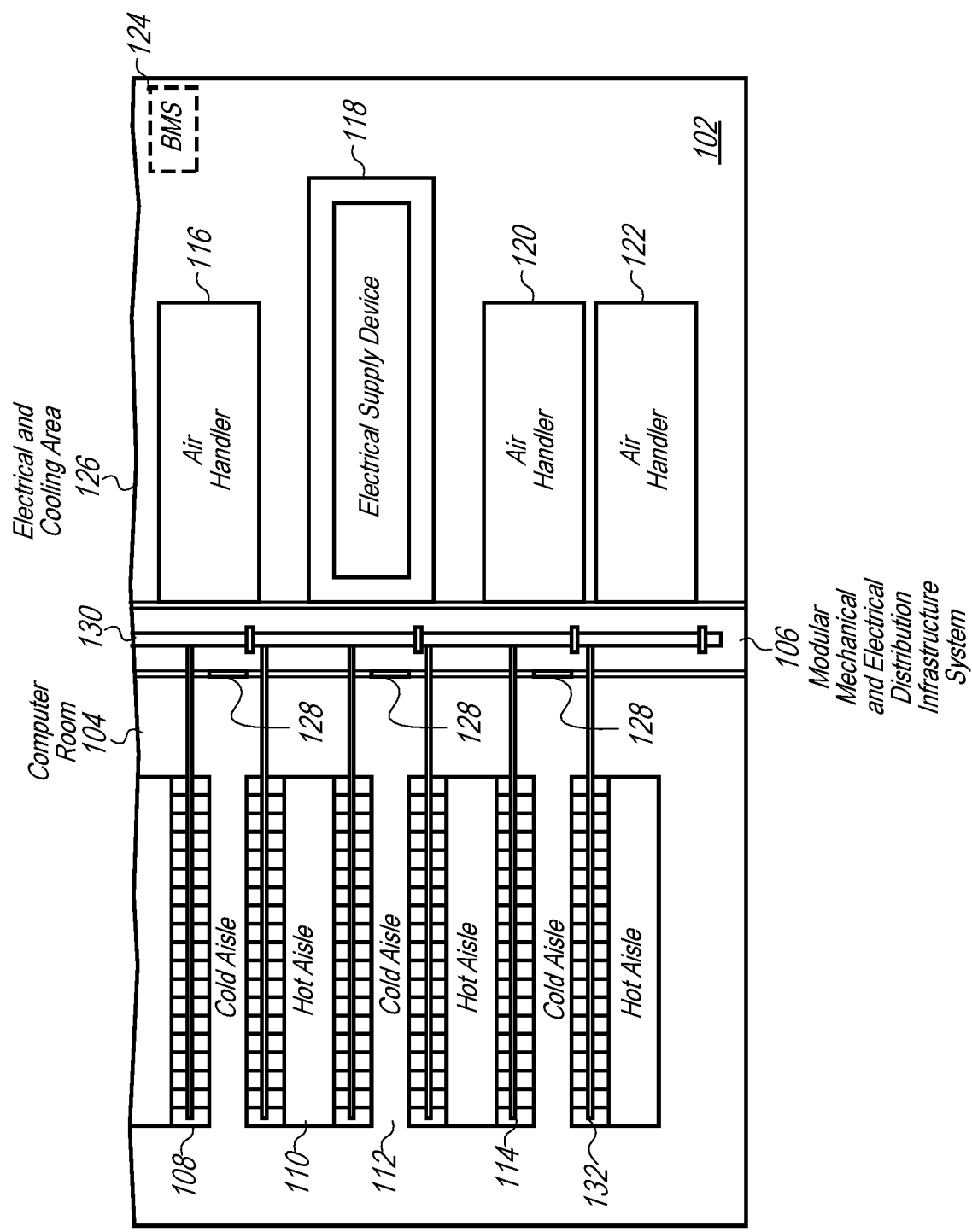
FIG. 1 illustrates a top view of a portion of a data center that includes a modular mechanical and electrical distribution infrastructure system that connects modular air handling devices and a modular electrical distribution device to a computer room of the data center, according to some embodiments.

The various embodiments described herein are susceptible to various modifications and alternative forms. Specific embodiments are shown by way of example in the drawings and will herein be described in detail. It should be understood, however, that the drawings and detailed description thereto are not intended to limit the disclosure to the particular form disclosed, but on the contrary, the intention is to cover all modifications, equivalents and alternatives falling within the spirit and scope of the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

Various embodiments of a modular mechanical and electrical distribution infrastructure system are disclosed. Also methods of installing and operating modular mechanical and electrical distribution infrastructure systems are disclosed, as well as arrangements of facilities that include modular mechanical and electrical distribution infrastructure systems, such as data centers. For simplicity, a modular mechanical and electrical distribution infrastructure system may be referred to herein simply as a mechanical and electrical distribution system, a mechanical and electrical distribution infrastructure system, or other similar descriptions.

According to one embodiment, a data center includes a modular air handling device, a modular electrical device, rack-mounted computing devices, and a mechanical and electrical distribution infrastructure system.

The modular air handling device includes a fan or blower. For example, the modular air handling device may include an air filtering system and a fan or blower, for example in climates where free-cooling is sufficient to remove waste heat from the rack-mounted computing devices. In other climates, a modular air handling device may additionally include a direct evaporative cooler, a mechanical chiller, or other air conditioning equipment. In some embodiments, the modular air handling device may include air filtration equipment, a blower or fan, an evaporative cooler or mechanical chiller, etc. all coupled to a common skid or chassis. In some embodiments, "free-cooling" may include directing outside air (that has been filtered) through a mechanical air plenum or plenums to cold aisles of a data center without expending additional work or resources to cool the air, such as through the use of an evaporative cooler or a mechanical chiller.

The modular electrical device includes a switchgear device, one or more transformers, or one or more uninterruptible power supplies. In some embodiments, a modular electrical device may include various combinations of these components and/or other electrical components mounted on a common skid or chassis. For example, a modular electrical device may include electrical equipment configured to receive utility power from a utility power provider, or an intermediate substation, and condition the power, for example by lowering the voltage of the power and/or filtering the power, such that the conditioned power is suitable to the distributed to power distribution equipment in a computer room of a data center.

The rack-mounted computing devices are organized into rows, wherein the rows of rack-mounted computing devices are separated by cold aisles from which cooling air is supplied to the rack-mounted computing devices and hot aisles that receive cooling air that has removed waste heat from the rack-mounted computing devices. For example, the rack-mounted computing devices may be computer servers, data storage servers, networking equipment, such as routers and switches, etc. mounted in standard server racks or other types of racks.

The mechanical and electrical distribution infrastructure system is situated in the data center such that the hot and cold aisles are on a first side of the mechanical and electrical distribution infrastructure system and the modular air handling device and the modular electrical device are on a second side of the mechanical and electrical distribution infrastructure system. The mechanical and electrical distribution infrastructure system includes a plurality of pre-fabricated panels coupled to a frame structure, wherein the pre-fabricated panels coupled to the frame structure form an air plenum that extends orthogonal to the hot and cold aisles. The mechanical and electrical distribution infrastructure system also includes power busway segments coupled to at least some of the pre-fabricated panels, wherein the at least some of the pre-fabricated panels, when coupled together, couple together the power busway segments to form a power busway that extends orthogonal to the hot and cold aisles According to one embodiment, a mechanical and electrical distribution infrastructure system includes pre-fabricated panels, that when coupled together, form a structure of an air plenum configured to distribute air from a modular air handling device to a plurality of cold aisles in a data center. The mechanical and electrical distribution infrastructure system also includes power busway segments coupled to at least some of the pre-fabricated panels, wherein the at least some pre-fabricated panels, when coupled together to form the structure of the air plenum, couple together the power busway segments to form a power busway configured to distribute electrical power from a modular electrical device to rack-mounted computing devices that are supplied cooling air from the plurality of cold aisles According to one embodiment, a method includes providing a plurality of pre-fabricated panels, that when coupled together, form a structure of an air plenum configured to distribute air from a modular air handling device to a plurality of cold aisles in a data center. The method also includes coupling the pre-fabricated panels to a structural frame at the data center to form the air plenum. In the method, the pre-fabricated panels include, prior to being coupled to the structural frame, power busway segments coupled to at least some of the pre-fabricated panels and adjustable louvers coupled to at least some of the pre-fabricated panels. In some embodiments, once the pre-fabricated panels are coupled to the structural frame, the power busway segments couple together to form a power busway to distribute electrical power to rack-mounted computers. In some embodiments, once the pre-fabricated panels are coupled to the structural frame, the adjustable louvers control air flow to the respective cold aisles.

As used herein, an "aisle" means a space next to one or more racks, such as a space between rows of racks. An "aisle" may be a "hot aisle" that encompasses a space between rows of racks that receives air that has been heated by heat producing components of computing devices in the rows of racks. Also, an aisle may be a "cold aisle" that encompasses a space between rows of racks that is provided cool air to be passed through computing devices in the rows of racks to remove heat from heat producing components in the computing devices. Also, an aisle may be a space or walkway in a data center that connects other aisles, such as an aisle running perpendicular to a plurality of cold aisles.

As used herein, a "building management system" may include software or hardware that implements a monitoring and/or control system for a data center. For example, a building management system may be implemented using a rack-mounted computing device, a separate computing device, a programmable logic controller (PLC), etc. In some embodiments, a BMS may monitor environmental conditions in a data center, such as temperature, humidity, indicia of fire or the absence thereof, power consumption, etc. In some embodiments, a BMS may also monitor security of a data center. For example, a BMS may collect security information from intrusion detection sensors, cameras, etc. In some embodiments, a BMS may control environmental conditions in a data center, such as temperature or humidity. Also, a BMS may provide warnings to a data center operator, such as in response to a potential security issue, such as an intrusion detection alarm, etc.

As used herein, "computing" includes any operations that can be performed by a computer, such as computation, data storage, data retrieval, or communications.

As used herein, a "computing device" includes any of various computer systems or components thereof. One example of a computing device is a rack-mounted server. As used herein, the term computer is not limited to just those integrated circuits referred to in the art as a computer, but broadly refers to a processor, a server, a microcontroller, a microcomputer, a programmable logic controller (PLC), an application specific integrated circuit, and other programmable circuits, and these terms are used interchangeably herein. In the various embodiments, memory may include, but is not limited to, a computer-readable medium, such as a random access memory (RAM). As used herein a "computing device" may also refer to data storage systems, such as storage servers, as well as networking systems, such as routers, switches, etc.

As used herein, "data center" includes any facility or portion of a facility in which computer operations are carried out. A data center may include servers and other systems and components dedicated to specific functions (e.g., e-commerce transactions, database management) or serving multiple functions. Examples of computer operations include information processing, communications, simulations, and operational control.

As used herein, a "modular" device is a combination of components physically coupled to one another. A modular device may include functional elements and systems, such as: heating ventilation and air conditioning (HVAC) systems, power distribution systems, fire suppression systems, and/or control systems, as well as structural elements, such a frame, housing, structure, container, etc. In some embodiments, a modular device is pre-assembled at a location off-site from a data center.

As used herein, a "space" means a space, area or volume.

Typically data center infrastructure is installed in a data center prior to rack computing devices being installed in the data center. Also, typically the data center infrastructure is assembled on site at the data center by various skilled workers, wherein the workers complete tasks sequentially. For example, a first group of skilled workers may install framing and another group of skilled workers, such as electricians, may install power busways. Yet another group of skilled workers may install lighting. Another group of skilled workers may install HVAC systems and ducting. Additionally other groups of skilled workers may install fire suppression systems, building management system components, etc. Since there is a limited amount of space in a data center for multiple groups of skilled workers to simultaneously complete various tasks, different groups of skilled workers typically complete tasks after previous groups of skilled workers have completed earlier tasks while other groups of skilled workers wait on a current group of skilled workers to finish tasks currently being performed. The tasks to be completed by each set of workers forms a "critical path" for the completion of the data center, wherein tasks in the critical path add to the overall amount of time required to complete construction and commissioning of the data center. When tasks can be completed ahead of time or concurrently with other tasks, the critical path may be shortened, meaning that the completion and commissioning of the data center may be performed in a shorter amount of time.

In some embodiments, a critical path for construction and commissioning of a data center may be significantly shortened by using pre-fabricated data center infrastructure modules, such as pre-fabricated panels of a modular mechanical and electrical distribution infrastructure system. For example, pre-fabricated panels of a modular mechanical and electrical distribution infrastructure system may be fabricated off-site from a data center location. Also, the pre-fabricated panels of the modular mechanical and electrical distribution infrastructure system may be fabricated outside of the critical path timeline. For example, a pre-fabricated panel of a modular mechanical and electrical distribution infrastructure system may be fabricated prior to construction of a data center or in parallel with other activities involved in constructing a data center. In some embodiments, the use of pre-fabricated panels for a modular mechanical and electrical distribution infrastructure system may shorten a critical path for construction of a data center. Also, efficiencies of scale may be realized wherein several pre-fabricated panels are fabricated off-site using an assembly line or other manufacturing techniques. Additionally, assembly defects may be avoided by using quality control processes in an assembly line or manufacturing process. For example, the installation of sensors, wiring, etc. at an off-site assembly location may be more closely monitored for quality assurance than is the case when such sensors and wiring are installed on-site at a data center location.

In some embodiments, pre-fabricated panels of a modular mechanical and electrical distribution infrastructure system may be re-used, thus reducing waste. For example, in some embodiments, pre-fabricated panels of a modular mechanical and electrical distribution infrastructure system may be relocated from a data center that is being de-commissioned to a new or other data center for re-use in the new or other data center.

In some embodiments, pre-fabricated panels of a modular mechanical and electrical distribution infrastructure system may provide, when assembled together, a single integrated multi-function infrastructure system. For example, installing the pre-fabricated panels may simultaneously install building management system sensors, such as pressure sensors, flow sensors, fire detection sensors, etc. Also, installing the pre-fabricated panels may simultaneously install an air distribution plenum, power busways, cooling fluid distribution pipes, lighting elements, etc.

In some embodiments, a modular mechanical and electrical distribution infrastructure system, as described herein, may allow for the late binding of modular air handling devices and/or modular electrical devices. For example, a quantity of modular air handling devices coupled to an air plenum of a modular mechanical and electrical distribution infrastructure system may initially be a minimum quantity that is required to meet the cooling needs of cold aisles that are supplied cooling air from the air plenum of the modular mechanical and electrical distribution infrastructure system. However, as additional cold aisles are added to the data center or as cooling requirements of the existing cold aisles increase, one or more additional modular air handling devices may be coupled to the air plenum of the modular mechanical and electrical distribution infrastructure system, in order to increase a cooling air supply capacity to the existing cold aisle or additional cold aisles.

FIG. 1 illustrates a top view of a portion of a data center that includes a modular mechanical and electrical distribution infrastructure system that connects modular air handling device and a modular electrical distribution device to a computer room of the data center, according to some embodiments.

Figure 3:
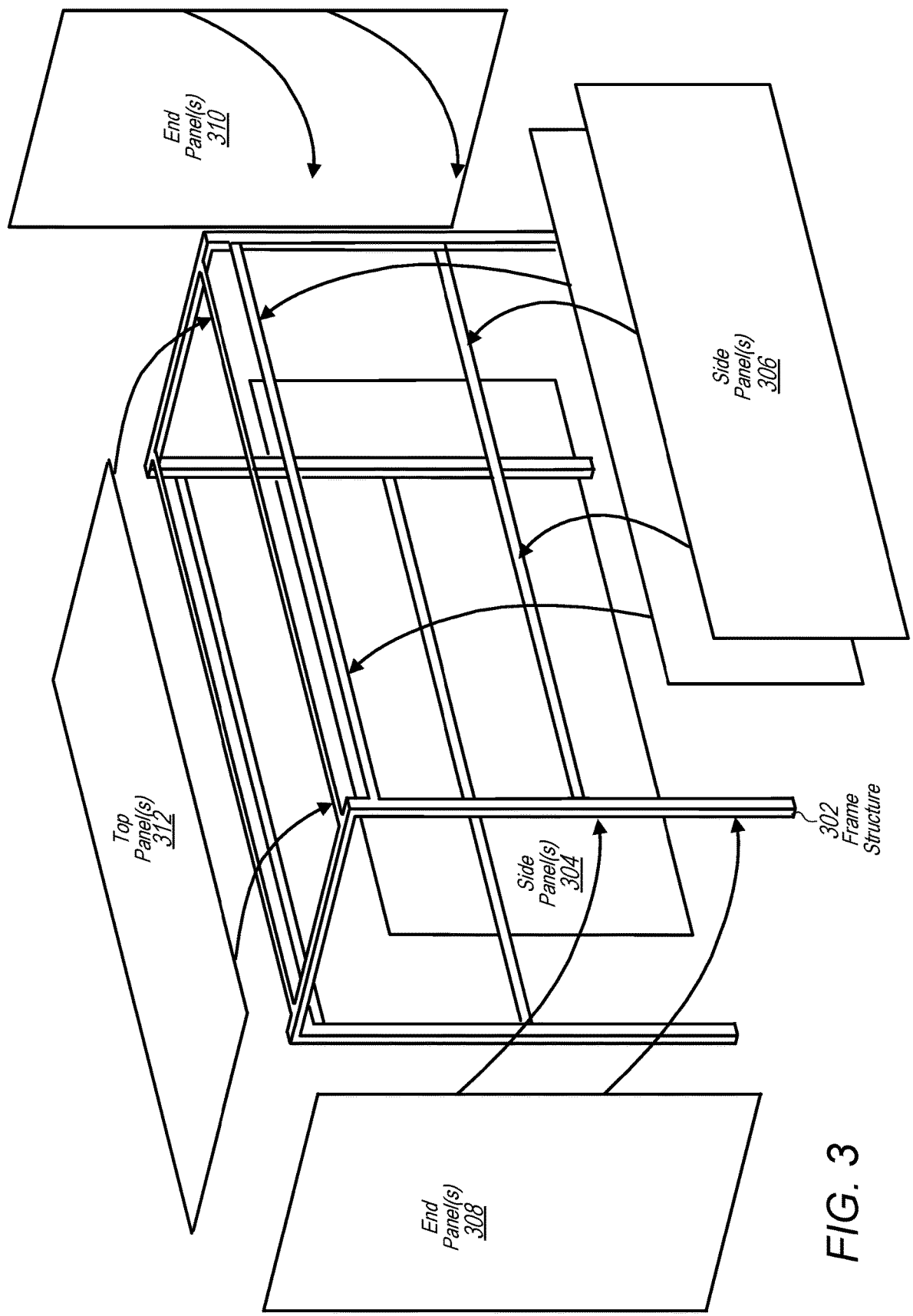
FIG. 3 illustrates a perspective view of a structural frame for a modular mechanical and electrical distribution infrastructure system and pre-fabricated panels of the modular mechanical and electrical distribution infrastructure system being attached to the structural frame, according to some embodiments.

Data center 102 includes computer room 104 and an electrical and cooling area 126. Also, data center 102 includes modular mechanical and electrical distribution infrastructure system 106 between the computer room 104 and the electrical and cooling area 126. The modular mechanical and electrical distribution infrastructure system 106 may include pre-fabricated panels attached to a frame structure. For example, FIGS. 3-4 illustrate example pre-fabricated panels that may be attached to a frame structure as part of a modular mechanical and electrical distribution infrastructure system, such as modular mechanical and electrical distribution infrastructure system 106.

In some embodiments, a computer room of a data center, such as computer room 104, may include rows of rack-mounted computing devices, such as servers mounted in standard server racks or other types of computing devices and racks. For example, computer room 104 includes rows of rack-mounted computing devices 108. In some embodiments, the rows of rack-mounted computing devices are organized such that the rows of rack-mounted computing devices are separated by cold aisles from which cooling air is supplied to the rack-mounted computing devices and hot aisles that receive cooling air that has removed waste heat from the rack-mounted computing devices. For example, hot aisles 110 are located between adjacent rows of rack-mounted computing devices 108. Also, cold aisles 112 are located between adjacent rows of rack-mounted computing devices. In some embodiments, aisles may alternative between cold aisles and hot aisles along a width of a computer room, for example as shown in FIG. 1.

In some embodiments, an electrical and cooling area of a data center, such as electrical and cooling area 126, may include modular air handling devices and modular electrical devices. For example, electrical and cooling area 126 includes modular air handling devices 116, 120, and 122. Electrical and cooling area 126 also includes modular electrical device 118.

In some embodiments, a modular air handling device, such as any of modular air handling devices 116, 120, or 122, may include a fan or blower mounted to a module frame. Additionally, the modular air handling device may include an inlet duct that receives air from an external environment and a filtration system that filters the air received from the external environment. The inlet duct and the filtration system may also be secured to the module frame. In some embodiments, a modular air handling device, such as any of modular air handling devices 116, 120, or 122, are separately moveable, such as via a forklift or crane. For example, in some embodiments, a modular air handling device may be mounted on a portable skid, as opposed to a fixed foundation. In some embodiments, depending on cooling requirements at a particular location, a modular air handling unit may further include a direct evaporative cooler that evaporates a fluid into an air stream being cooled to lower a temperature of the air stream. Also, in some embodiments, a modular air handling device may include coils that circulate a cooling fluid, such as chilled water or refrigerant. In some embodiments, a modular air handling device may include a compressor and expansion valve that perform mechanical work on a refrigerant that is circulated through the coils, wherein the mechanical work causes heat to be removed from the air stream and rejected to an exterior environment.

In some embodiments, a modular electrical device, such as modular electrical device 118, may include a set of electrical components mounted on a portable skid, wherein the electrical components are configured to condition power to be supplied to a computer room and ensure a reliable supply of power to the computer room, such as computer room 104. In some embodiments, multiple modular electrical devices may supply electrical power to a single computer room, or a single modular electrical device may supply power to multiple computer rooms, or any combination of computer rooms and modular electrical devices may be used to supply electrical power to the computer rooms. In some embodiments, a modular electrical device, such as modular electrical device 118, may include a transformer configured to receive utility power, for example from a utility power sub-station, and lower a voltage of the power to a voltage of power to be distributed to computer rooms in the data center. Also, the modular electrical device 118, may include switchgear configured to control the flow of power and to protect against over drawing of the power. In some embodiments, the modular electrical device may further include uninterruptible power supplies configured to supply power during interruptions in receiving power from the utility power provider. In some embodiments, the various components of a modular electrical device may be mounted to a common skid and may be moveable, for example via a forklift or crane, as a common unit or module. In some embodiments, a modular electrical device may further include additional pieces of electrical equipment such as components that filter and condition incoming power to provide a clean power supply to a computer room (e.g. filtering out noise, harmonics, etc.).

In some embodiments, a modular mechanical and electrical distribution infrastructure system, such as modular mechanical and electrical distribution infrastructure system 106, is situated in a data center such that a computer room, such as computer room 104, is on a first side of the modular mechanical and electrical distribution infrastructure system and modular air handling devices and modular electrical devices, such as modular air handling devices 116, 120, and 122 and modular electrical device 118 are on a second side of the modular mechanical and electrical distribution infrastructure system. As described in more detail in FIG. 2, a modular mechanical and electrical distribution infrastructure system, such as modular mechanical and electrical distribution infrastructure system 106, may form an air plenum that runs orthogonal to hot and cold aisles of the computer room on its first side, such as hot aisles 110 and cold aisles 112 of computer room 104. In a similar manner, a modular mechanical and electrical distribution infrastructure system, such as modular mechanical and electrical distribution infrastructure system 106, may form one or more power busways that run orthogonal to hot and cold aisles of the computer room on its first side, such as hot aisles 110 and cold aisles 112 of computer room 104.

In some embodiments, a modular mechanical and electrical distribution infrastructure system, such as modular mechanical and electrical distribution infrastructure system 106, may receive cooling air into an air plenum of the modular mechanical and electrical distribution infrastructure system from modular air handling devices 116, 120, and 122 and may direct the cooling air into cold aisles, such as cold aisles 112, via adjustable louvers, such as adjustable louvers 128. In some embodiments, modular air handling devices 116, 120, and 122, may be controlled by a building management system, such as building management system 124, wherein the building management system causes the modular air handling devices 116, 120, and 122 to control to a constant or near constant air pressure in the air plenum of the modular mechanical and electrical distribution infrastructure system. Note that there may be some fluctuation in pressure, but the BMS may be driving the pressure to a set-point pressure by increasing or decreasing blower or fan speeds or causing additional modular air handling devices to startup or shutdown. Cooling air pressure control is further discussed in more detail in regard to FIG. 10.

In some embodiments, a building management system, such as building management system 124, may also control adjustable louvers, such as adjustable louvers 128. In some embodiments, adjustable louvers, such as adjustable louvers 128, may be independently controlled based on disparate cooling requirements associated with different ones of the cold aisles, such as cold aisles 112. For example, a building management system, such as BMS 124, may receive temperature measurements related to rack mounted computing devices in rows 108 and may separately adjust cooling air flow to different ones of the cold aisles based on the conditions of the rack-mounted computing devices that are supplied cooling air from the different respective cold aisles. In some embodiments, a building management system, such as BMS 122, may receive other measurements, such as power consumption, processor workload, etc. and may infer cooling requirements of the rack-mounted computing devices associated with the different cold aisles based on the received measurements.

In some embodiments, a building management system, such as BMS 124, may be a central management system for a data center, or may be local to a particular computer room and set of modular air handling devices and/or modular electrical devices. In some embodiments, a building management system, such as BMS 124, may execute on a server in one of the racks of rows of rack-mounted computing devices 108. In some embodiments, a building management system, such as BMS 124, may be implemented on a process logic controller (PLC) or other stand-alone computing device. In some embodiments, a building management system, such as BMS 124, may be pre-installed on a pre-fabricated panel of a modular mechanical and electrical distribution infrastructure system. For example, a building management system implemented on a PLC may be mounted to a top pre-fabricated panel of a modular mechanical and electrical distribution infrastructure system.

In some embodiments, a data center, such as data center 102, includes exhaust fans (not shown) that exhaust air from hot aisles, such as hot aisles 110, to an external environment. For example, in some embodiments, air may be drawn into a data center via air handlers 116, 120, and 122. The air may be filtered and directed into an air plenum of modular mechanical and electrical distribution infrastructure system 106 directly or may be cooled via an evaporative cooler. The air may pass through the air plenum of modular mechanical and electrical distribution infrastructure system 106 and be directed towards cold aisles 112. The air may be drawn out of the cold aisles 112 and pass over heat producing components of rack-mounted computing devices 108. The heated air may then be exhausted into hot aisles 110 and may be exhausted from a ceiling space connected to hot aisles 110 via exhaust fans (not shown) of the data center.

In some embodiments, a modular mechanical and electrical distribution infrastructure system, such as modular mechanical and electrical distribution infrastructure system 106, may include one or more power busways, such as power busway 130. The power busways may receive electrical power from a modular electrical device, such as modular electrical device 118, and may distribute the electrical power to aisle/row distribution systems, such as row busways 132.

Figure 2:
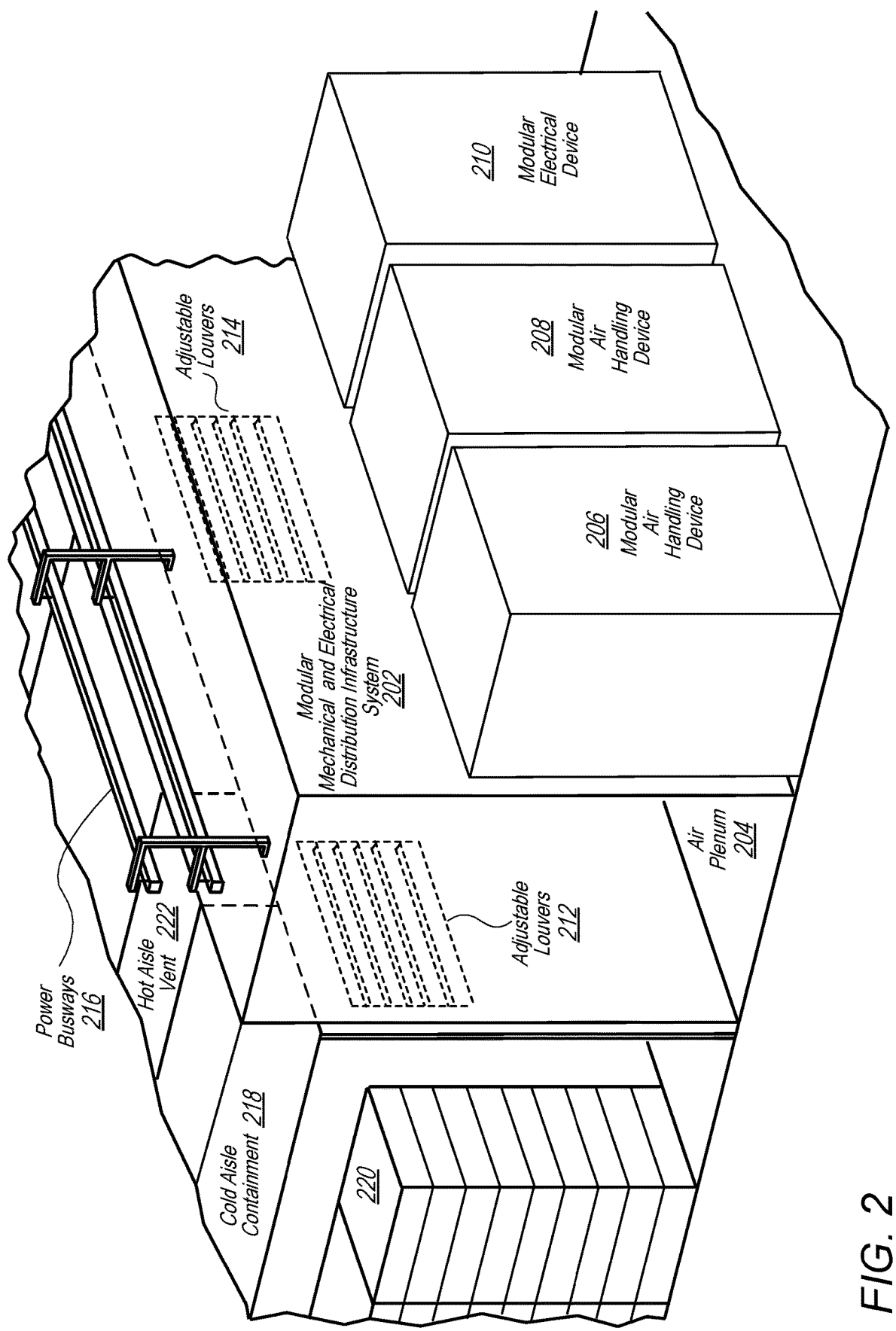
FIG. 2 illustrates a perspective view of a portion of a data center that includes a modular mechanical and electrical distribution infrastructure system that connects modular air handling devices and a modular electrical distribution device to a computer room of the data center, according to some embodiments.

FIG. 2 illustrates a perspective view of a portion of a data center that includes a modular mechanical and electrical distribution infrastructure system that connects modular air handling devices and a modular electrical distribution device to a computer room of the data center, according to some embodiments.

In some embodiments, modular mechanical and electrical distribution infrastructure system 202 shown in FIG. 2 may be the same or similar to modular mechanical and electrical distribution infrastructure system 106 shown in in FIG. 1. In a similar manner, modular air handling devices 206 and 208 may be the same or similar to modular air handlers 120 and 122. Also, modular electrical device 210 may be the same or similar to modular electrical device 118. Additionally, adjustable louvers 212 and 214 may be the same or similar to adjustable louvers 128. Also, power busways 216 may be the same or similar to power busways 130. Moreover, rack-mounted computing devices 220 may form rows of rack-mounted computing devices, such as rows of rack-mounted computing devices 108.

As can be seen in FIG. 2, modular mechanical and electrical distribution infrastructure system 202 may form an air plenum 204 that runs orthogonal to cold aisles of a computer room and that directs cooling air from modular air handling devices, such as modular air handling devices 206 and 208, to respective cold aisles via adjustable louvers, such as adjustable louvers 212 and 214. In some embodiments, each of adjustable louvers 212, 214, and other adjustable louvers of modular mechanical and electrical distribution infrastructure system 202 are aligned with respective ones of cold aisles of a computer room and are configured to adjust a flow of cooling air from air plenum 204 to the respective cold aisles.

In some embodiments, a computer room of a data center includes hot aisle and/or cold aisle containment structures that abut or connect to a modular mechanical and electrical distribution infrastructure system, such as modular mechanical and electrical distribution infrastructure system 202. For example cold aisle containment structure 218 includes a ceiling over the cold aisles of the adjoining computer room, wherein the ceiling separates cold air in the computer room from hot air that is vented from a hot aisle via hot aisle vent 222. In some embodiments, hot air exhausted from a hot aisle, such as from hot aisle vent 222, may flow into a ceiling space above a computer room. The ceiling space may extend above air plenum 204 of modular mechanical and electrical distribution infrastructure system 202 and connect back to modular air handling devices 206 and 208. Thus in some embodiments, wherein modular air handling devices recirculate at least a portion of the cooling air, the modular air handling devices may draw in the recirculated air from an environment surrounding the modular air handling devices and that is contained away from the cold aisles, via the cold aisle containment structure 218.

In some embodiments, initially electrical power and cooling may be supplied to a modular mechanical and electrical distribution infrastructure system via open ends of air plenum 204 before modular air handling devices 206 and 208 and modular electrical device 210 are installed.

FIG. 3 illustrates a perspective view of a structural frame for a modular mechanical and electrical distribution infrastructure system and pre-fabricated panels of the modular mechanical and electrical distribution infrastructure system being attached to the structural frame, according to some embodiments.

In some embodiments, a modular mechanical and electrical distribution infrastructure system, such as modular mechanical and electrical distribution infrastructure system 106 or 202 may be formed from pre-fabricated panels attached to a frame structure. The pre-fabricated panels may be delivered to a data center location with infrastructure components, such as power busway segments, cooling circuit piping segments, pressure sensors, flow sensors, adjustable louvers, fire detection sensors, fire suppression piping, surveillance devices, such as cameras, motion detectors, etc., and associated wiring already integrated into the pre-fabricated panels. In some embodiments, the pre-fabricated panels may include wiring harnesses or other quick connect connectors at panel joints to connect infrastructure systems across panels. In some embodiments, pre-fabricated panels of a modular mechanical and electrical distribution infrastructure system may be transported to a data center location as a set of flat-stacked panels, wherein at least some of the panels are stacked on top of each other. For example the pre-fabricated panels may be stacked in a standard shipping container, such as an ISO container, another type of shipping container, on a truck bed, such as a flatbed truck, or stacked on other shipping means.

Once at a data center location, the pre-fabricated panels may be attached to a frame structure to form an air plenum of a modular mechanical and electrical distribution infrastructure system and to couple together power busway segments of a modular mechanical and electrical distribution infrastructure system to form one or more power busways for the modular mechanical and electrical distribution infrastructure system. In some embodiments, a modular mechanical and electrical distribution infrastructure system may include one or more primary power busways and a reserve power busway.

For example, FIG. 3 illustrates top panel 312 being mounted on a top portion of frame structure 302. Also, side panels 304 and 306 are being mounted on sides of frame structure 302 and end panels 308 and 310 are being mounted on ends of frame structure 302. In some embodiments, a top panel, side panels, or end panels may be continuous panels or may be broken into smaller sub-panels wherein more than one panel covers a respective top, side, or end of the frame structure.

In some embodiments a modular mechanical and electrical distribution infrastructure system may span the width of multiple cold aisles, hot aisles, and rows of rack-mounted computing devices. For example, in some embodiments a modular mechanical and electrical distribution infrastructure system may have a length of more than 120 feet. Also in some embodiments, a modular mechanical and electrical distribution infrastructure system may have a height considerably taller than standard racks for rack-mounted computing devices. For example, in some embodiments, a modular mechanical and electrical distribution infrastructure system may have a height of 10 feet or taller. Also, in some embodiments a modular mechanical and electrical distribution infrastructure system may have a width sufficient to form a walkway in the air plenum of the modular mechanical and electrical distribution infrastructure system, wherein a technician can service infrastructure system components in the air plenum, such as adjustable louver motors, pressure sensors, air flow sensors, fires sensors, etc. by walking in the air plenum. For example, in some embodiments a modular mechanical and electrical distribution infrastructure system may have a width of 8 feet or greater.

Figure 4A:
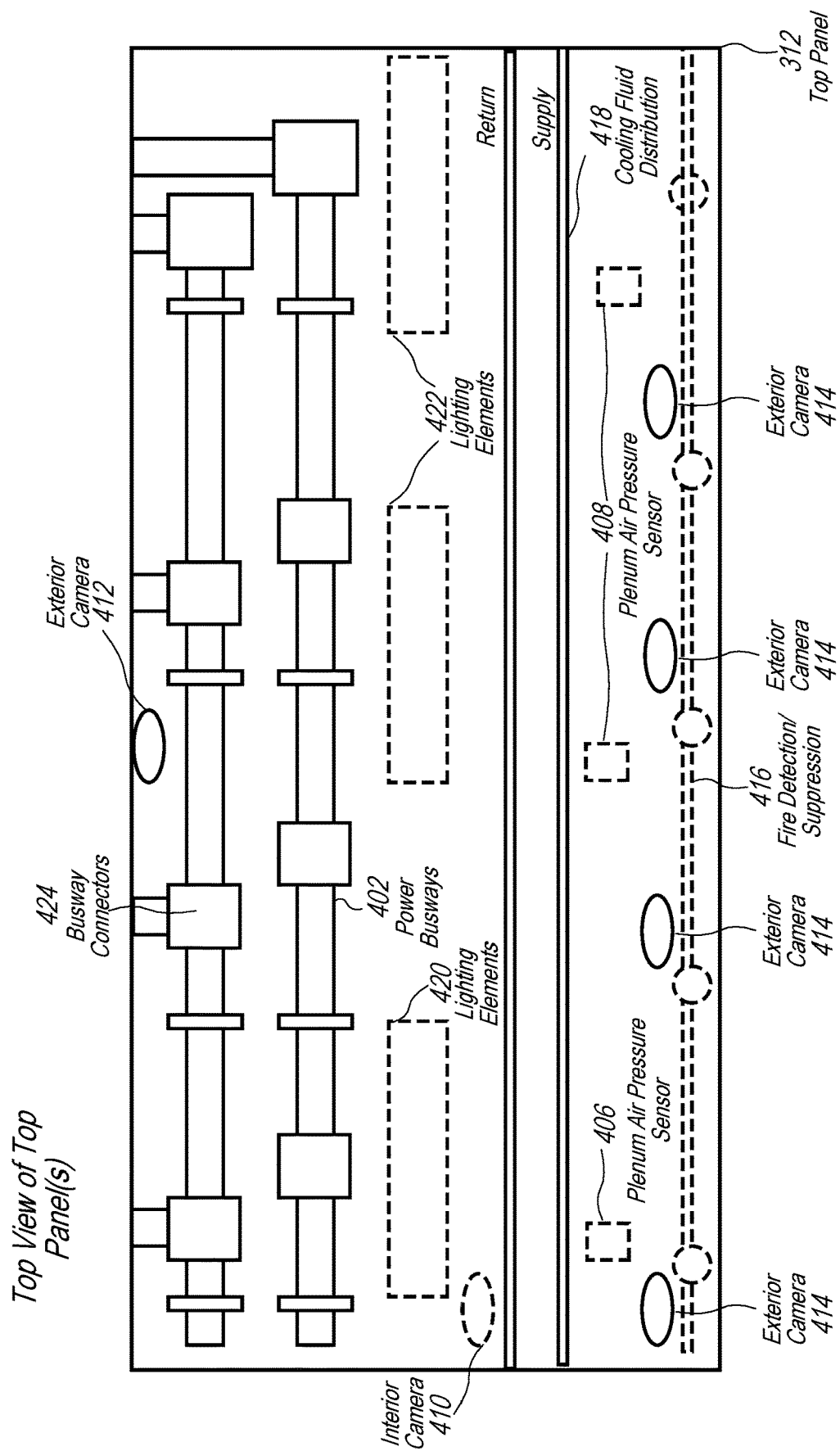
FIG. 4A illustrates a top view of a top pre-fabricated panel of a modular mechanical and electrical distribution infrastructure system, according to some embodiments.

FIG. 4A illustrates a top view of a top pre-fabricated panel of a modular mechanical and electrical distribution infrastructure system, according to some embodiments.

In some embodiments, a top pre-fabricated panel of a modular mechanical and electrical distribution infrastructure system, such as top panel 312, may include any or all of the infrastructure system components shown in FIG. 4. In some embodiments, any of the pre-fabricated panels described herein may include similar pre-fabricated components as described in FIGS. 4A-4E.

For example, top panel 312 illustrated in FIG. 4 includes lighting elements 420 and 422 on an underside of the top panel that faces the interior of the air plenum. The top panel 312 also includes plenum air pressure sensors 406 and 408 on the underside of the top panel that faces the interior of the air plenum. The pressure sensors may be spaced along a length of the air plenum in order to get representative measurements of air pressure in the air plenum.

In addition, top panel 312 includes fire detection and/or fire suppression system 416 mounted on an underside of the top panel that faces the air plenum. The fire detection system may include various sensors such as a smoke detector, particulate sensor, or other types of sensors that detect indicia of a fire. The fire suppression system may include fire suppression piping and sprinklers or other types of fire suppression systems. In some embodiments, wherein the top panel is broken into smaller sub-panels the fire suppression piping may be mounted to the sub-panels as piping segments that couple together. In some embodiments, wherein the top panel is shipped as a single panel, the fire suppression piping may be pressure tested and shipped under pressure, such that any leaks that develop during shipping are easily detectable due to a loss of pressure.

In some embodiments, top panel 312 also includes an interior camera 410 (or multiple interior cameras 410) oriented such that the interior cameras monitor access to the air plenum. In some embodiments, top panel 312 also includes exterior cameras that monitor spaces around the modular mechanical and electrical distribution infrastructure system. For example, exterior camera 412 may monitor a side of the modular mechanical and electrical distribution infrastructure system facing the modular air handling devices and modular electrical devices. In some embodiments, each of cameras 414 may be oriented to observe a cold aisle in the computer room. In some embodiments, a top panel, such as top panel 312, may additionally or alternatively include other surveillance devices in addition to or in place of cameras, such as motion sensors, etc.

In some embodiments, top panel 312 includes piping for a cooling fluid distribution system, such as cooling fluid distribution system 418. In some embodiments, the piping may be broken down into segments wherein each segment is attached to a sub-panel of top panel 312. In other embodiments, top panel 312 may be shipped as a single top panel and the piping may be attached and pressurized prior to shipping for leak detection.

In some embodiments, power busways 402 are mounted on an exterior side of top panel 312. In some embodiments, power busways 402 may include a primary power busway and reserve or secondary power busway. In some embodiments, power busways 402 may connect to a modular electrical device on a side of the modular mechanical and electrical distribution infrastructure system and may distribute power to aisle/row power busways running orthogonal to the power busways 402. In some embodiments, power busways 402 may include busway connectors that connect power distribution panels on a side of the modular mechanical and electrical distribution infrastructure system to the power busways 402.

Figure 4B:
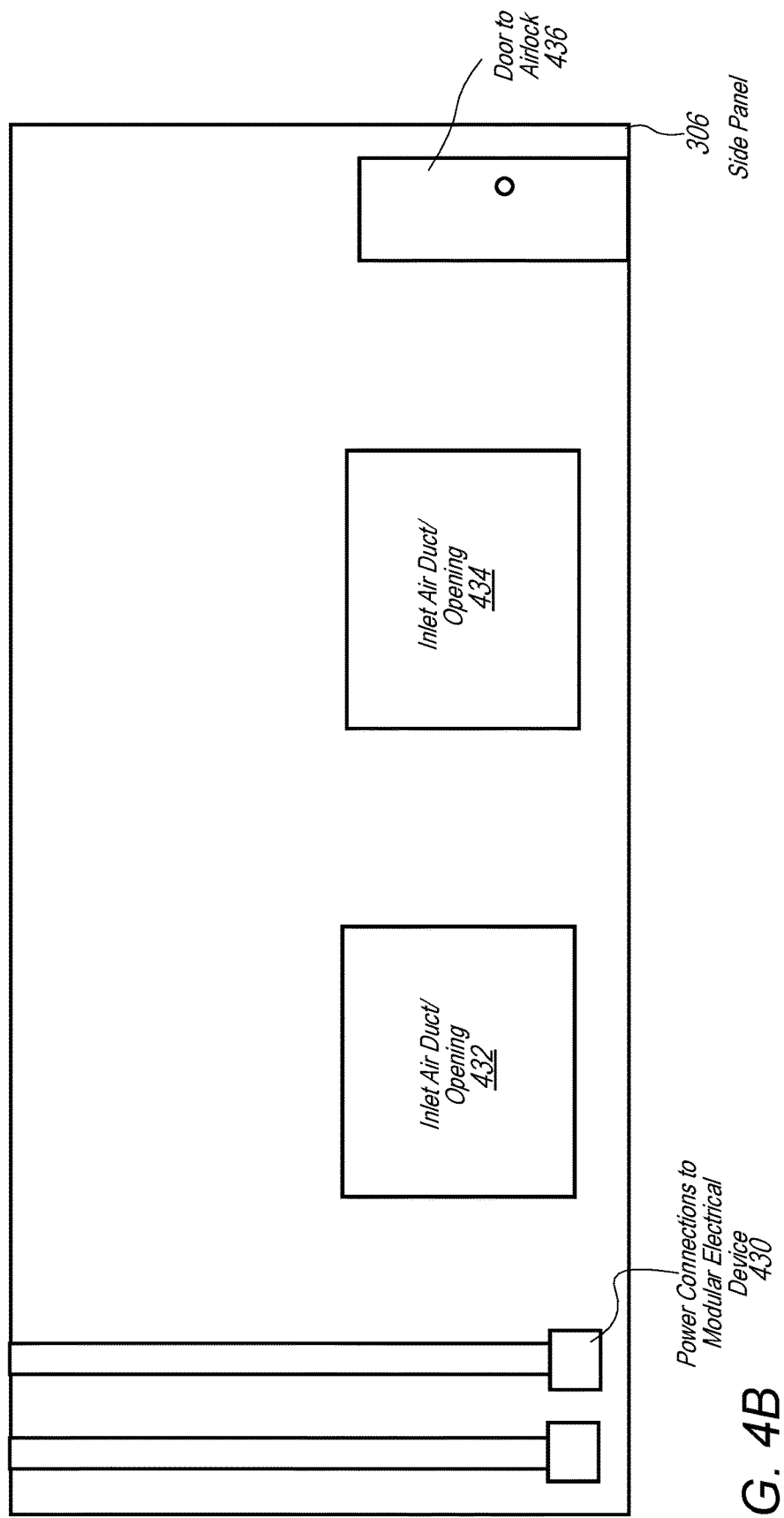
FIG. 4B illustrates a side view of a pre-fabricated side panel of a modular mechanical and electrical distribution infrastructure system, according to some embodiments.

FIG. 4B illustrates a side view of a pre-fabricated side panel of a modular mechanical and electrical distribution infrastructure system, according to some embodiments.

Side panel 306 includes power connections 430 to a modular electrical device, such as modular electrical device 210 or 118. Side panel 306 also includes ducts or openings, such as inlet air ducts/openings 432 and 434 that connect modular air handling devices such as modular air handling devices 116, 120, and 122, or 206 and 208 to the air plenum of the modular mechanical and electrical distribution infrastructure system. In some embodiments, an air plenum of a modular mechanical and electrical distribution infrastructure system may include an airlock at either or both ends of the air plenum. For example, side panel 306 includes airlock door 436.

Figure 4C:
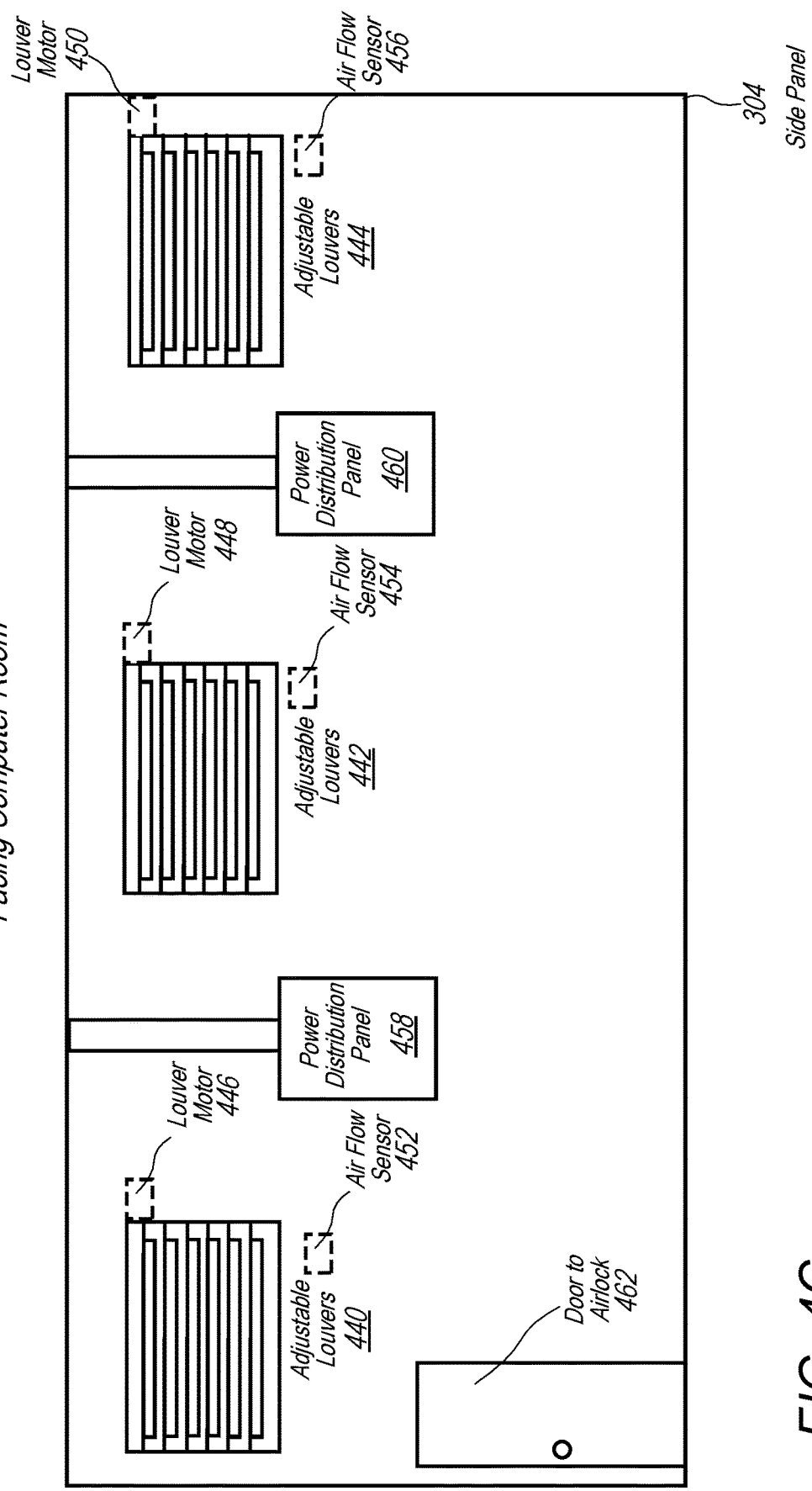
FIG. 4C illustrates a side view of a pre-fabricated side panel of a modular mechanical and electrical distribution infrastructure system, according to some embodiments.

FIG. 4C illustrates a side view of a pre-fabricated side panel of a modular mechanical and electrical distribution infrastructure system, according to some embodiments.

Side panel 304 includes adjustable louvers 440, 442, and 444, along with louver motors 446, 448, and 450. In some embodiments, the louver motors 446, 448, and 450 may be located on a side of the side panel 304 that faces the interior of the air plenum. Also side panel 304 may include one or more air flow sensors 452, 454, or 456 on an interior side of the side panel. In some embodiments, an air flow sensor may be associated with each of the adjustable louvers to determine an air flow rate of cooling air out of the air plenum via the respective adjustable louver.

Note that in some embodiments, the air plenum is a shared resource for cooling air that is supplied to various cold aisles from respective adjustable louvers associated with the cold aisles. Because, in some embodiments, modular air handling devices control a pressure of the air plenum to a constant pressure, flow control to the cold aisles is controllable by controlling adjustable louver positions. In some embodiments, the adjustable louvers may have various shapes and sizes. For example, in some embodiments an adjustable louver may have a width of 10 feet and a height of 2 feet or vice versa.

In some embodiments, side panel 304 includes airlock door 462 which may align with airlock door 436 on opposing sides of the airlock.

In some embodiments, side panel 304 includes power distribution panels 458 and 460. In some embodiments, power distribution panels 458 and 460 may be connected to power busways 402 via busway connectors 424. In some embodiments aisle/row power distribution systems for respective rows of rack-mounted computing devices may couple with power distribution panels 458 and 460 to supply power to the respective rack-mounted computing devices in the rows. In some embodiments, the power distribution panels 458 and 460 may be sized to distribute various amounts of electrical power. For example power distribution panels 458 and 460 may be rated to distribute 400 amps or more of electrical power, each.

FIG. 4D illustrates an end view of a pre-fabricated end panel of a modular mechanical and electrical distribution infrastructure system, according to some embodiments.

In some embodiments, airlock doors 436 and 462 are located on side panels 304 and 306 near end panel 310. Also slightly behind end panel 310 within the air plenum, airlock door 474 may separate the airlock from the rest of the air plenum. Also airlock ceiling 476 may separate the airlock from the rest of the air plenum. In some embodiments, air may flow through an air plenum over an airlock via a space in the air plenum above a ceiling for the airlock. For example space 478 may allow for air flow over an airlock. In some embodiments, wherein a modular mechanical and electrical distribution infrastructure system is expanded, it may not be necessary to remove an airlock at either or both ends of the modular mechanical and electrical distribution infrastructure system. Instead air may flow over the airlock as described above.

FIG. 4E illustrates an end view of a pre-fabricated end panel of a modular mechanical and electrical distribution infrastructure system, according to some embodiments.

In some embodiments, an end panel, such an end panel 308 may be a simple panel.

In some embodiments, any of the pre-fabricated panels described herein may be made of sheet metal, plastic or other suitable materials.

Figure 4F:
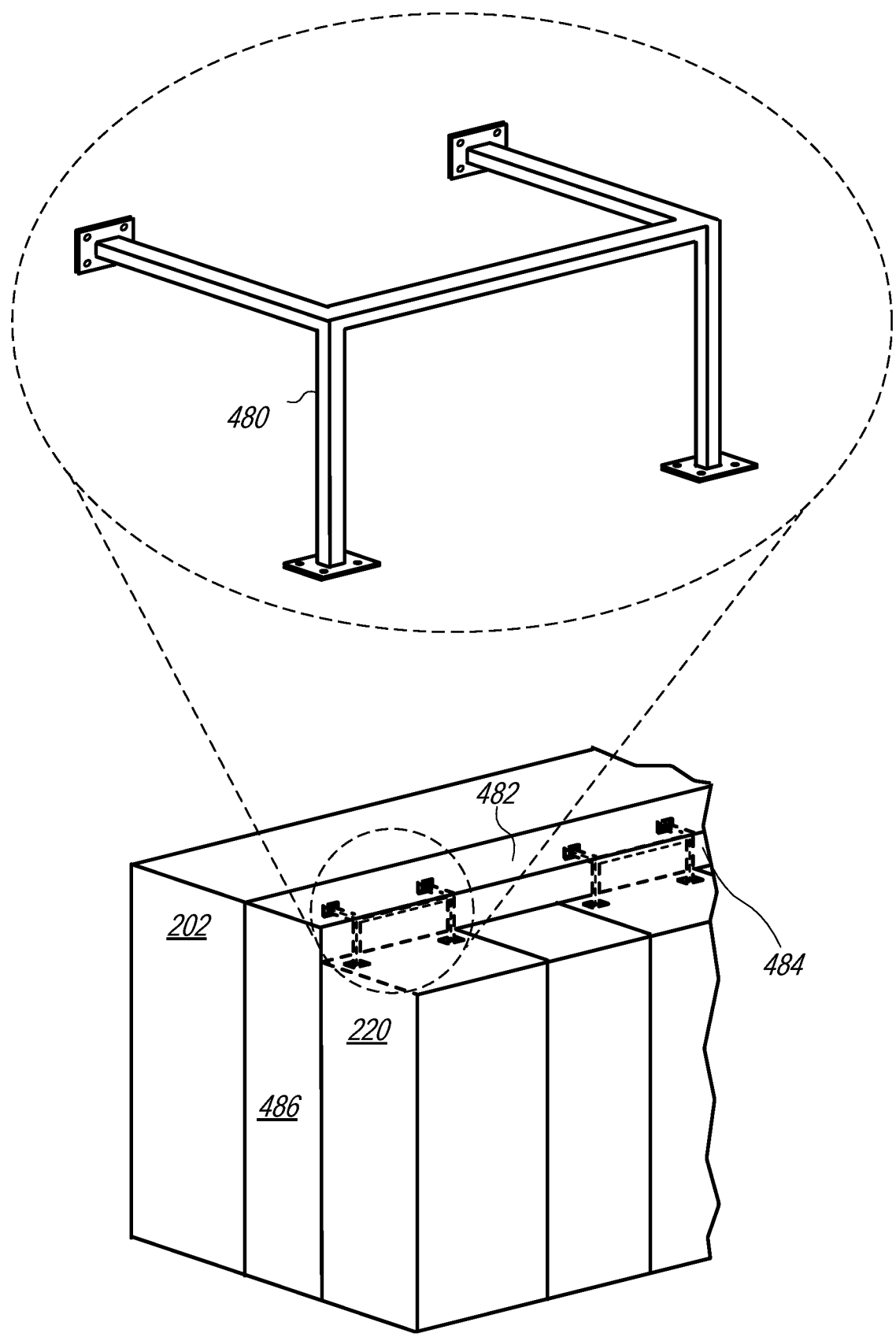
FIG. 4F illustrates a bridge connector that supports power connections and air containment panels connecting a mechanical and electrical distribution infrastructure system to a framework for a row of racks, according to some embodiments.

FIG. 4F illustrates a bridge connector that supports power connections and air containment panels connecting a mechanical and electrical distribution infrastructure system to a framework for a row of racks, according to some embodiments.

In some embodiments, a modular mechanical and electrical distribution system may further include one or more bridge connectors to bridge an avenue running perpendicular to rows of rack computing systems and perpendicular to aisles between the rows of racks. For example, in some embodiments, a modular mechanical and electrical distribution system may include one or more bridge connectors, such as bridge connector 480. The bridge connector may be configured to couple with a side panel of a modular mechanical and electrical distribution system, such as side panel 304 that includes power distribution panels 458 and 460 and adjustable louvers 440, 442, and 444. In some embodiments, a bridge connector, such as bridge connector 480 may mount to a side panel adjacent to, below, or even with power distribution panels, such as power distribution panels 458 and 460. In some embodiments, a bridge connector, such as bridge connector 480, may support cable trays, wiring and/or power busways that distribute electrical power from power distribution panels of a modular mechanical and electrical distribution system, such as modular mechanical and electrical distribution system 202.

In some embodiments, air containment panels may further be coupled to a set of bridge connectors, such as bridge connectors 480, wherein the air containment panels separate air in the avenue and cold aisles from hot return air in a ceiling space of a data center. For example, air containment panels 482 and 484 may couple to bridge connector 480 to separate cold air in space 486 (e.g. an avenue) from warm air that flows in a sub-ceiling space above racks computer systems 220 and above modular mechanical and electrical system 202.

Figure 5:
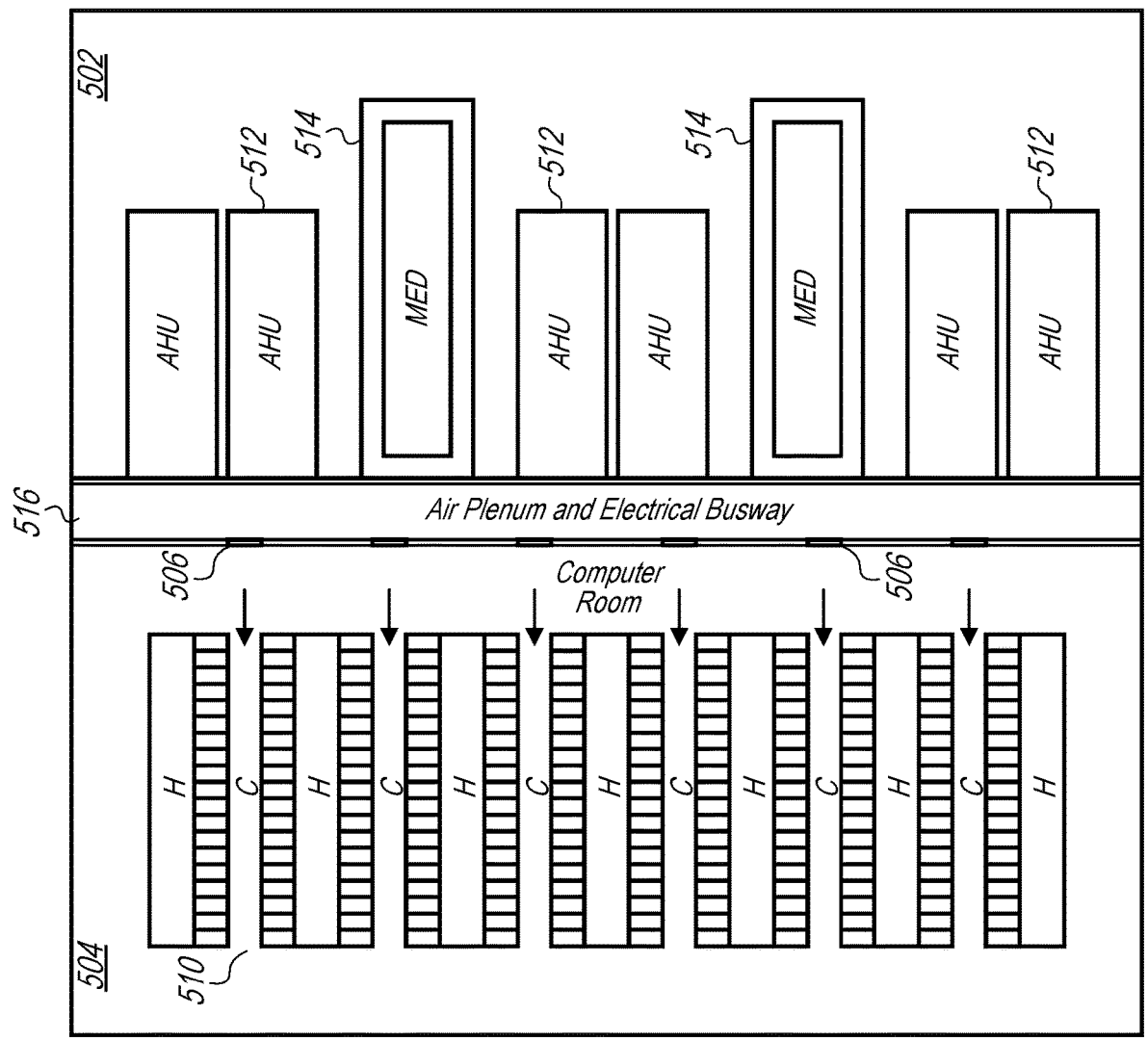
FIG. 5 illustrates a top view of a data center comprising a computer room on a first side of the data center, cooling and electrical supply equipment on a second side of the data center, and a modular mechanical and electrical distribution infrastructure system connecting the first and second sides of the data center, according to some embodiments.

FIG. 5 illustrates a top view of a data center comprising a computer room on a first side of the data center, cooling and electrical supply equipment on a second side of the data center, and a modular mechanical and electrical distribution infrastructure system connecting the first and second sides of the data center, according to some embodiments.

In some embodiments, a modular mechanical and electrical distribution infrastructure system, such as modular mechanical and electrical distribution infrastructure system 516, may couple with various combinations of air handling units and/or electrical distribution units. For example, modular mechanical and electrical distribution infrastructure system 516 is coupled to air handing units 512 and modular electrical distribution units 514 that are organized in a repeating pattern. In some embodiments, electrical distribution units may be located on one end of the modular mechanical and electrical distribution infrastructure system and the air handling units may be located along another end of the modular mechanical and electrical distribution infrastructure system. In some embodiments, air handling units and electrical distribution units may be intermixed as shown in FIG. 5. Also, as shown in FIG. 5, in some embodiments, each adjustable louver 506 may align with a cold aisle 510 of a computer room 504 on a first side of the modular mechanical and electrical distribution infrastructure system 516, wherein cooling and electrical space 502 is on a second side of the modular mechanical and electrical distribution infrastructure system 516. Note that both cooling and electrical supply are located on a common side of the data center, as opposed to opposing sides of the data center.

Figure 6:
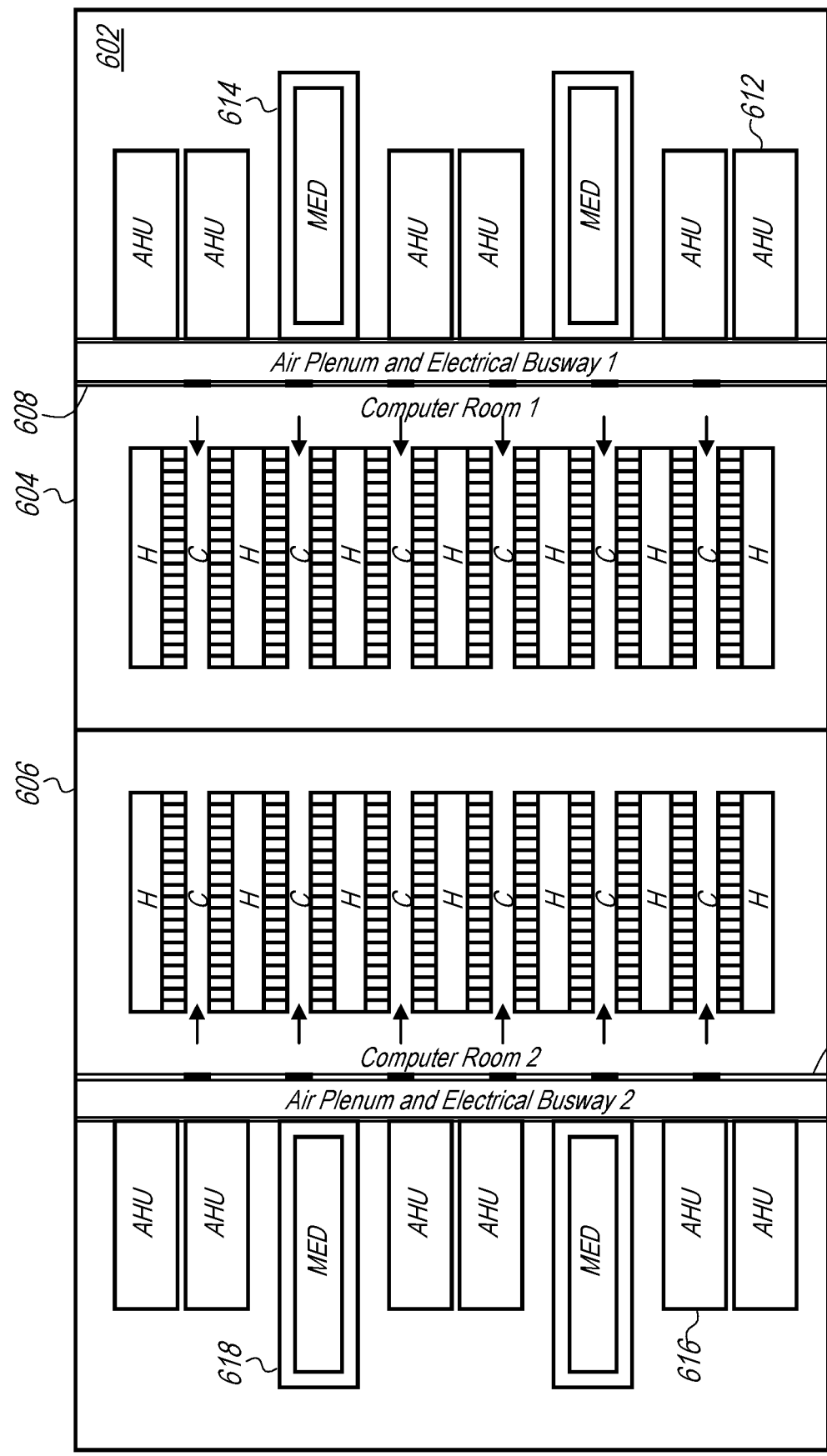
FIG. 6 illustrates a top view of a data center with a mirrored arrangement of computer rooms, modular mechanical and electrical distribution infrastructure systems, and cooling and electrical supply equipment, according to some embodiments.

FIG. 6 illustrates a top view of a data center with a mirrored arrangement of computer rooms, modular mechanical and electrical distribution infrastructure systems, and cooling and electrical supply equipment, according to some embodiments.

In some embodiments, a data center may be organized in a mirror arrangement. For example, data center 602 includes mirrored computer rooms, modular mechanical and electrical distribution infrastructure systems, and cooling and electrical spaces.

For example, data center 602 includes computer room 604 and an additional computer room 606 adjacent to computer room 604 and on an opposite side of computer room 604 from a side of the computer room 604 where the air handling units 612 and modular electrical distribution units 614 are located. Also data center 602 includes modular mechanical and electrical distribution infrastructure system 608 between computer room 604 and air handling units 612 and modular electrical distribution units 614. Additionally, data center 602 includes another modular mechanical and electrical distribution infrastructure system 610 on an opposite side of computer room 606 from a side of computer room 606 that is adjacent to computer room 604. Additionally, data center 602 includes modular mechanical and electrical distribution infrastructure system 610 between computer room 606 and air handling units 616 and modular electrical distribution units 618.

Figure 7:
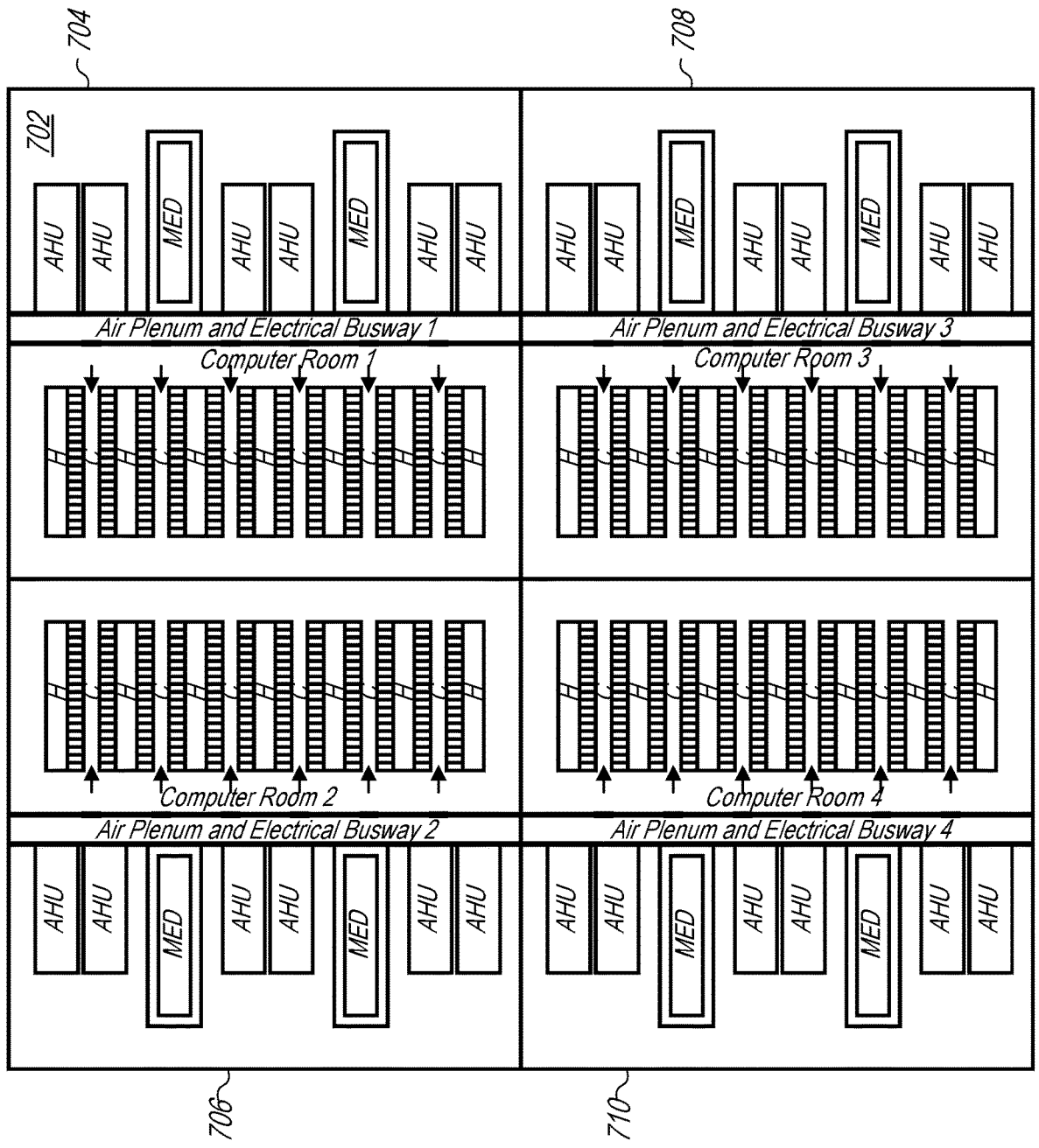
FIG. 7 illustrates a top view of a data center with a mirrored arrangement of computer rooms, modular mechanical and electrical distribution infrastructure systems, and cooling and electrical supply equipment that has been expanded, according to some embodiments.

FIG. 7 illustrates a top view of a data center with a mirrored arrangement of computer rooms, modular mechanical and electrical distribution infrastructure systems, and cooling and electrical supply equipment that has been expanded, according to some embodiments.

FIG. 7 illustrates a similar mirrored arrangement as shown in FIG. 6. However, the data center has been expanded. For example data center 702 includes a first section 704 that includes a first computer room, a first modular mechanical and electrical distribution infrastructure system, and first set of air handling units and modular electrical distribution units. Data center 702 also includes additional sections 706, 708, and 710 that each include additional computer rooms, sets of air handling units and modular electrical distribution units, and modular mechanical and electrical distribution infrastructure systems.

Figure 8:
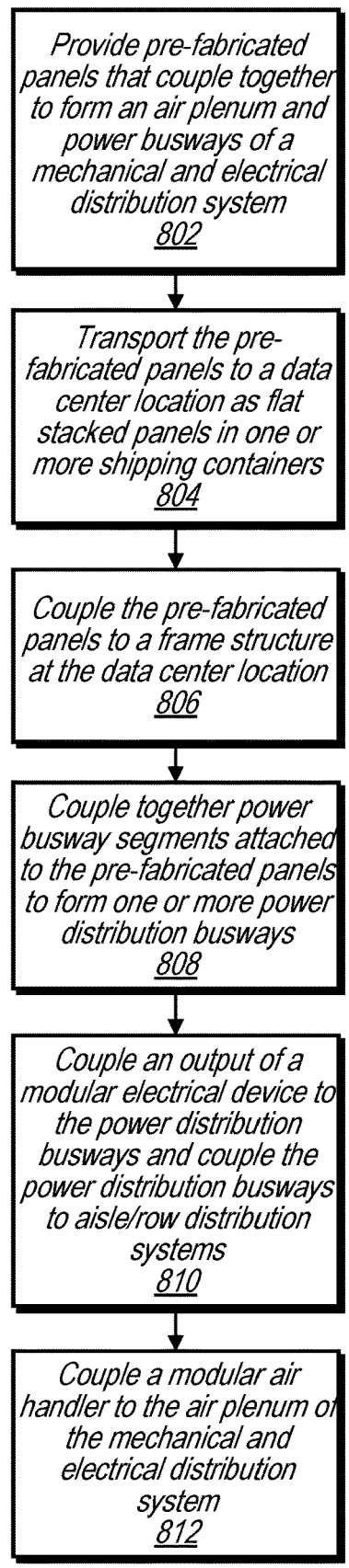
FIG. 8 is a flowchart illustrating a process of providing and installing a modular mechanical and electrical distribution infrastructure system at a data center location, according to some embodiments.

FIG. 8 is a flowchart illustrating a process of providing and installing a modular mechanical and electrical distribution infrastructure system, according to some embodiments.

At 802, pre-fabricated panels for a mechanical and electrical distribution infrastructure system are provided. The pre-fabricated panels may include infrastructure system components, such as electrical power busway segments, building management sensors, adjustable louvers, fire detection and fire suppression system components, etc. pre-integrated into the pre-fabricated panels before being installed at a data center location. In some embodiments, the pre-fabricated panels may be flat-stackable panels that are loaded into a shipping container or placed on a truck bed.

At 804, the pre-fabricated panels are transported to a data center location as flat stacked-panels in one or more shipping containers. In some embodiments, the pre-fabricated panels could be transported in other ways, such as on a bed of a flat-bed truck.

At 806, the pre-fabricated panels are coupled to a frame structure at the data center location. For example, the pre-fabricated panels may be coupled to the frame structure via fasteners, such as bolts, screws, rivets, etc. Also, the pre-fabricated panels may be attached to the frame structure via other means such as welding, clips, etc. In some embodiments, the pre-fabricated panels may also be coupled to one another, for example to form a sealed air plenum. In some embodiments, joints between pre-fabricated panels may be sealed, for example via an adhesive tape or sealant.

At 808, other infrastructure components of the pre-fabricated panels are coupled together. For example, power busway segments integrated into the pre-fabricated panels may be attached together to form a power busway that runs along a length of the mechanical and electrical distribution infrastructure system.

At 810, electrical connections may be made to the mechanical and electrical distribution infrastructure system. For example, an inlet side of the electrical power busway may be coupled to a modular electrical device that conditions electrical power received from a power source, such as a generator or a utility power provider. Also, power distribution panels pre-integrated into side panels of the mechanical and electrical distribution infrastructure system may be connected to aisle/row power distribution systems of a computer room that is fed electrical power via the electrical power busway of the mechanical and electrical distribution infrastructure system.

At 812, other infrastructure systems may be attached to the mechanical and electrical distribution infrastructure system. For example, a modular air handling device may be attached to an opening or duct that connects an output of the modular air handling device to an air plenum of the mechanical and electrical distribution infrastructure system.

Figure 9:
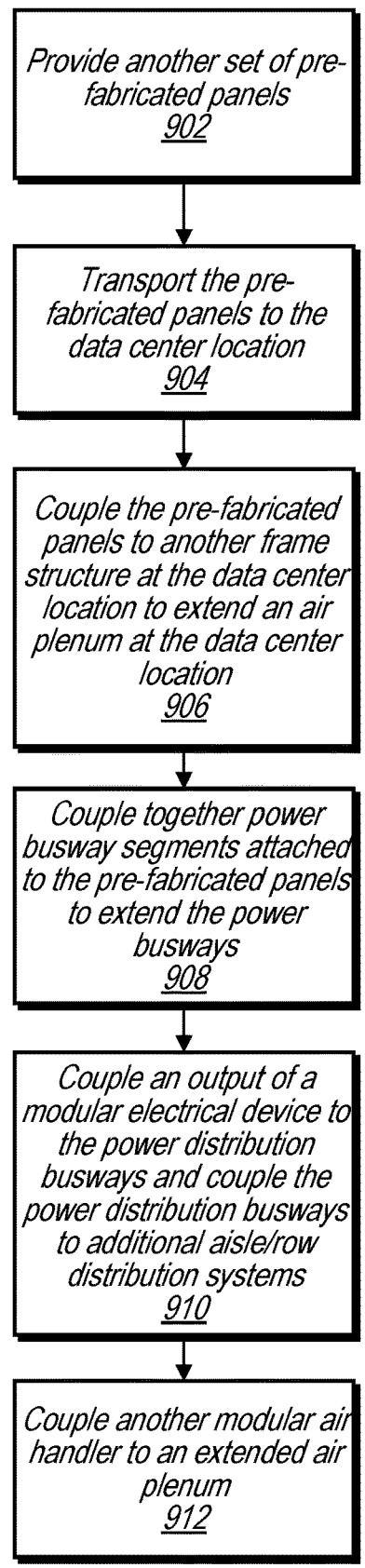
FIG. 9 is a flowchart illustrating a process of expanding a modular mechanical and electrical distribution infrastructure system at a data center location, according to some embodiments.

FIG. 9 is a flowchart illustrating a process of expanding a modular mechanical and electrical distribution infrastructure system, according to some embodiments.

At 902, another set of pre-fabricated panels is provided. The pre-fabricated panels may be similar to the pre-fabricated panels provided at 802.

At 904, the additional pre-fabricated panels are transported to the data center location.

At 906, the pre-fabricated panels are attached to another frame structure at the data center location to expand a mechanical and electrical distribution infrastructure system at the data center location. For example, the additional pre-fabricated panels may extend a data center, such as shown in FIG. 6, to include additional sections, such as shown in FIG. 7.

At 908, power busway segments integrated into the additional pre-fabricated panels are coupled together.

At 910, the additional power busway segments that have been coupled together are coupled to additional modular electrical devices that feed electrical power to the additional power busway. In some embodiments, the additional power busway may be connected to an existing power busway and may receive power fed to the original power busway via a connection between the original power busway and an expanded portion of the original power busway. Also addition power distribution panels included in the additional pre-fabricated panels may be attached to power distribution systems for additional rows or aisles at the data center.

At 912, additional modular air handling devices may be attached to an expanded air plenum that has been expanded by coupling the additional pre-fabricated panels to the additional frame structure.

Figure 10:
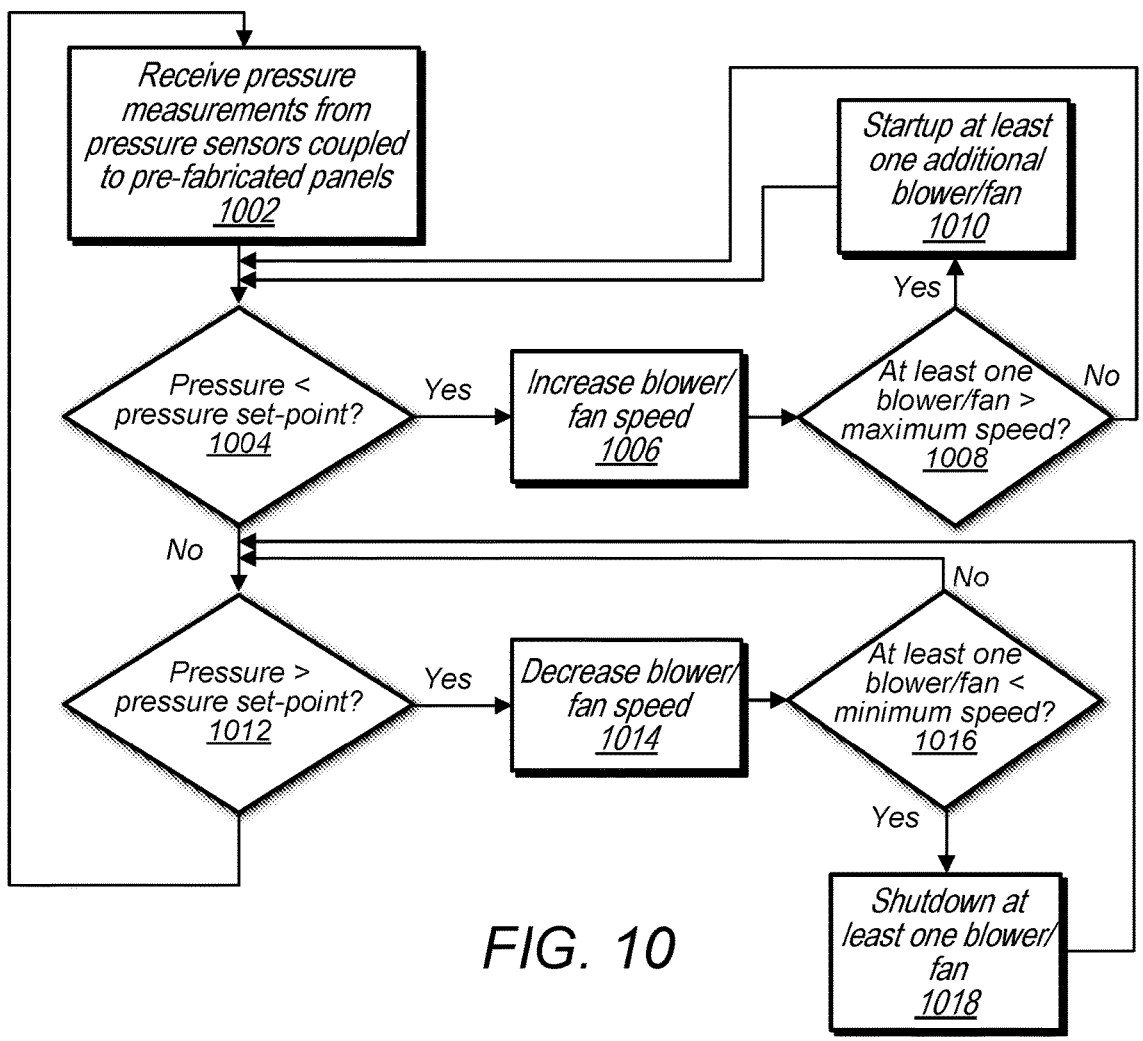
FIG. 10 is a flowchart illustrating a process of controlling a pressure in an air plenum of a modular mechanical and electrical distribution infrastructure system, according to some embodiments.

FIG. 10 is a flowchart illustrating a process of controlling a pressure in an air plenum of a modular mechanical and electrical distribution infrastructure system, according to some embodiments.

As discussed above, in some embodiments, a building management system may pressure control an air plenum of a mechanical and electrical distribution infrastructure system.

For example, at 1002, a controller, such as a building management system, receives pressure measurements from pressure sensors pre-integrated into pre-fabricated panels of a mechanical and electrical distribution infrastructure system. For example, pressure measurements may be received from pressure sensors, such as pressure sensors 406 and 408.

At 1004 and 1012, the controller determines, based on the received pressure measurements, whether the air pressure in the air plenum of the mechanical and electrical distribution infrastructure system is above or below a pressure set-point for the air plenum. In some embodiments, the controller may control to a particular set-point value or a set-point range. If the pressure is below set-point, the controller increases a fan or blower speed at 1006 and if the pressure is above set-point, the controller decreases a fan or blower speed at 1014. If at least one of the fans or blowers (e.g. one of the modular air handling devices or a fan or blower of one of the modular air handling devices, wherein the modular air handling devices include multiple fans or blowers), is operating below a minimum speed for efficiency, the controller causes the fan or blower (or modular air handling device) to be placed on standby or shutdown. Conversely if at least one of the fans or blowers is running above a maximum speed for efficiency or cannot reach the pressure set-point, the controller causes another fan, blower, or modular air handling device to be started. For example, if at 1008 it is determined that at least one fan is operating above a maximum speed or cannot increase speed to reach the air pressure set point, at 1010 at least one additional blower or fan is started up. Also, if at 1016 it is determined that at least one fan or blower is operating below a minimum speed, at 1018 the at least one fan or blower is shutdown.

Figure 11:
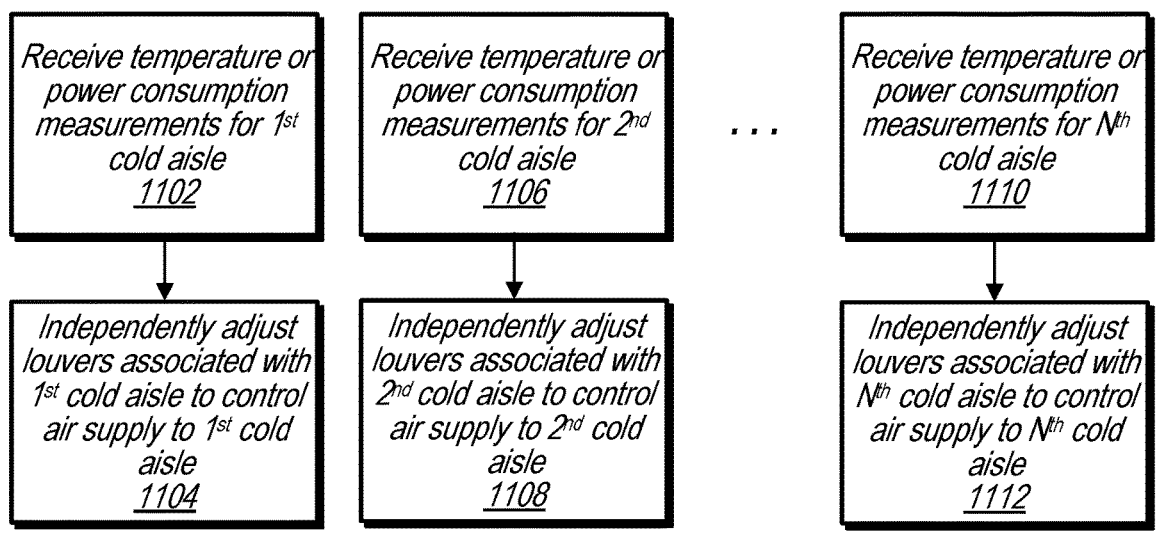
FIG. 11 is a flowchart illustrating a process of independently controlling air flow from a modular mechanical and electrical distribution infrastructure system to respective cold aisles of a computer room, according to some embodiments.

FIG. 11 is a flowchart illustrating a process of independently controlling air flow from a modular mechanical and electrical distribution infrastructure system to respective cold aisles of a computer room, according to some embodiments.

At 1102, 1106, and 1110, a controller, such as a building management system, receives temperature or power consumption measurements for rack-mounted computing devices that are cooled via cooling air supplied from a first cold aisle, a second cold aisle and any number of additional cold aisles. In some embodiments, different ones of the measurements may be associated with different ones of the cold aisles.

At 1104, 1108, and 1112, the controller independently adjusts adjustable louvers associated with each of the cold aisles based on the temperature and/or power consumption measurements received at 1102, 1106, and 1110. In some embodiments, various types of flow control devices may be used in addition to or instead of adjustable louvers. For example in some embodiments an adjustable damper may be used.

The various methods as illustrated in the figures and described herein represent example embodiments of methods. The order of method may be changed, and various elements may be added, reordered, combined, omitted, modified, etc.

Although the embodiments above have been described in considerable detail, numerous variations and modifications will become apparent to those skilled in the art once the above disclosure is fully appreciated. It is intended that the following claims be interpreted to embrace all such variations and modifications.

What is claimed is:

1. A data center, comprising:
   a modular air handling device comprising a fan or blower;
   a modular electrical device comprising a switchgear device, transformer, or uninterruptible power supply;
   rack-mounted computing devices organized into rows, wherein the rows of rack-mounted computing devices are separated by:
     cold aisles from which cooling air is supplied to the rack-mounted computing devices and
     hot aisles that receive cooling air that has removed waste heat from the rack-mounted computing devices; and
   a mechanical and electrical distribution infrastructure system situated in the data center such that:
     the hot and cold aisles are on a first side of the mechanical and electrical distribution infrastructure system; and
     the modular air handling device and the modular electrical device are on a second side of the mechanical and electrical distribution infrastructure system,
   wherein the mechanical and electrical distribution infrastructure system comprises a plurality of pre-fabricated panels coupled to a frame structure, wherein the plurality of pre-fabricated panels coupled to the frame structure form an air plenum that extends orthogonal to the hot and cold aisles, and
   wherein the mechanical and electrical distribution infrastructure system comprises power busway segments coupled to two or more of the plurality of pre-fabricated panels, wherein the two or more of the plurality of pre-fabricated panels, when coupled together, couple together the power busway segments to form a power busway that extends orthogonal to the hot and cold aisles.

2. The data center of claim 1, wherein the mechanical and electrical distribution infrastructure system further comprises:
   an opening configured to couple the air plenum to the modular air handling device such that the air plenum receives cooling air from the fan or blower of the modular air handling device, wherein the opening is provided in any one of the plurality of pre-fabricated panels; and
   adjustable louvers that align with respective ones of the respective cold aisles and are adjustable to adjust respective cooling air flows from the air plenum directed toward the respective ones of the cold aisles, wherein the adjustable louvers are provided in any one or more of the plurality of pre-fabricated panels.

3. The data center of claim 2, wherein:
   the data center comprises a building management system;
   the mechanical and electrical distribution infrastructure system further comprises:
   air pressure sensors or air flow sensors and associated wiring configured to couple the air pressure sensors or air flow sensors with the building management system, wherein the air pressure sensors or air flow sensors and associated wiring are provided in any one or more of the plurality of pre-fabricated panels; and
   the building management system comprises a computing device storing program instructions, that when executed on or across one or more processors, cause the one or more processors to:

control the fan or the blower of the modular air handling device to maintain a set-point pressure in the air plenum; and control the adjustable louvers to control the respective cooling air flows from the air plenum directed toward the respective cold aisles based on workloads or temperatures of respective sets of the rack-mounted computing devices in the respective rows that are supplied cooling air from the respective cold aisles.

4. The data center of claim 1, wherein:

at least one of the of the two or more pre-fabricated panels comprising a power busway segment further comprises a power-busway connector configured to couple the power busway segment coupled to the at least one of the two or more pre-fabricated panels to an output of the modular electrical device; and at least some of the two or more of the pre-fabricated panels comprising a power busway segment further include power-busway connectors configured to couple at least one of the power busway segments to busways that receive power from the power busway of the mechanical and electrical distribution infrastructure system and distribute the power from the power busway of the mechanical and electrical distribution infrastructure system to the rack-mounted computing devices.

5. The data center of claim 1, wherein the rack-mounted computing devices that are organized into the rows are included in a first computing room of the data center, wherein the modular mechanical and electrical distribution infrastructure system is on a first side of the first computing room, wherein the data center further comprises:

another computing room adjacent to the first computing room on an opposing side of the first computing room from the first side of the first computing room where the modular mechanical and electrical distribution infrastructure system is located; and another modular mechanical and electrical distribution infrastructure system and associated modular air handling device and modular electrical device located on an opposing side of the other computing room from a side of the other computing room that is adjacent to the first computing room.

6. A mechanical and electrical distribution infrastructure system, comprising:

a plurality of pre-fabricated panels, that when coupled together, form a structure of an air plenum configured to distribute air from a modular air handling device to a plurality of cold aisles in a data center, and power busway segments coupled to two or more of the plurality of pre-fabricated panels, wherein the two or more of the plurality of pre-fabricated panels, when coupled together to form the structure of the air plenum, couple together the power busway segments to form a power busway configured to distribute electrical power from a modular electrical device to rack-mounted computing devices that are supplied cooling air from the plurality of cold aisles.

7. The mechanical and electrical distribution infrastructure system of claim 6, further comprising:

adjustable louvers coupled to any one or more of the plurality of pre-fabricated panels, wherein the adjustable louvers align with respective ones of the plurality of cold aisles and are adjustable to adjust respective cooling air flows from the air plenum of the mechanical and electrical distribution infrastructure system toward the respective ones of the plurality of cold aisles.

8. The mechanical and electrical distribution infrastructure system of claim 7, further comprising:

pressure sensors coupled to any one or more of the plurality of pre-fabricated panels, wherein the pressure sensors are positioned on the any one or more of the plurality of pre-fabricated panels to measure air pressure within the air plenum of the mechanical and electrical distribution infrastructure system at a plurality of locations along the air plenum.

9. The mechanical and electrical distribution infrastructure system of claim 8, further comprising:

air flow sensors coupled to any one or more of the plurality of pre-fabricated panels adjacent to the adjustable louvers, wherein respective ones of the air flow sensors are configured to measure a respective airflow out of the air plenum via a respective one of the adjustable louvers.

10. The mechanical and electrical distribution infrastructure system of claim 8, further comprising:

a computing device comprising a memory and one or more processors, wherein the memory stores program instructions, that when executed on, or across, the one or more processors, cause the one or more processors to:

control a fan or a blower of the modular air handling device, based on pressure measurements from the pressure sensors, such that a pressure set-point for cooling air flowing through the air plenum is maintained; and control the adjustable louvers, based on temperature or power consumption measurements from the rack-mounted computing devices that are supplied the cooling air from the respective one of the plurality of cold aisles, wherein controlling the adjustable louvers comprises opening or closing the louvers to adjust the respective cooling air flows directed to the respective one of the plurality of cold aisles.

11. The mechanical and electrical distribution infrastructure system of claim 6, wherein any one or more of the plurality of pre-fabricated panels are configured to be:

stacked on top of one another for shipment to a data center location; and assembled on-site at the data center location to form the structure for the air plenum and to couple together the power busway.

12. The mechanical and electrical distribution system of claim 6, further comprising:

an airlock configured to substantially equalize a pressure of air in the airlock with a pressure of air in the air plenum prior to opening to the air plenum.

13. The mechanical and electrical distribution system of claim 6, further comprising:

lighting elements and associated wiring coupled to any one or more of the plurality of pre-fabricated panels, wherein the lighting elements are configured to illuminate a walkway within the air plenum of the mechanical and electrical distribution infrastructure system.

14. The mechanical and electrical distribution system of claim 6, further comprising:

fire detection sensors or fire suppression equipment coupled to any one or more of the plurality of pre-fabricated panels, wherein the fire detection sensors are configured to detect smoke or other indicia of fire in the air plenum, or wherein the fire suppression equipment, when coupled together, is configured to suppress a fire in the air plenum.

15. The mechanical and electrical distribution system of claim 6, further comprising:
cooling fluid distribution pipe segments coupled to any two or more of the plurality of pre-fabricated panels, wherein the any two or more of the plurality of pre-fabricated panels, when coupled together to form the structure of the air plenum, couple together the cooling fluid distribution pipe segments to form a cooling fluid distribution system configured to circulate cooling fluid to the plurality of cold aisles or a plurality of hot aisles.

16. The mechanical and electrical distribution system of claim 6, further comprising:
cameras or motion sensors coupled to any one or more of the plurality of pre-fabricated panels, wherein the cameras or motion sensors are configured to monitor:
access to the air plenum;
a computing room on a first side of the mechanical and electrical distribution system; or
the modular air handling device and the modular electrical device, which are located on a second side of the mechanical and electrical distribution system.

17. The mechanical and electrical distribution system of claim 6, further comprising a structural frame, wherein the plurality of pre-fabricated panels are coupled to the structural frame at the data center and are structurally supported by the structural frame.

18. The mechanical and electrical distribution system of claim 6, further comprising a bridge connector configured to couple with a frame structure for the rack-mounted computing devices, wherein the bridge connector is configured to support electrical connectors that connect the power busway of the mechanical and electrical distribution system to a power distribution system for the rack-mounted computing devices.

19. The mechanical and electrical distribution system of claim 18, further comprising one or more air containment panels configured to couple to the bridge connector.

20. A method comprising:
providing a plurality of pre-fabricated panels, that when coupled together, form a structure of an air plenum configured to distribute air from a modular air handling device to a plurality of cold aisles in a data center; and
coupling the plurality of pre-fabricated panels to a structural frame at the data center to form the air plenum,
wherein the plurality of pre-fabricated panels, prior to being coupled to the structural frame, comprise:
two or more power busway segments coupled to any two or more respective ones of the plurality of the pre-fabricated panels; or
adjustable louvers coupled to any one or more of the plurality of the pre-fabricated panels.

21. The method of claim 20, wherein the plurality of pre-fabricated panels, prior to be being coupled to the structural frame, comprise the two or more power busway segments coupled to the any two or more respective ones of the plurality of pre-fabricated panels and comprise the adjustable louvers coupled to any one or more of the plurality of the pre-fabricated panels, the method further comprising:
coupling an outlet of the modular air handling device to any one or more of the plurality of pre-fabricated panels; and
coupling together the two or more power busway segments coupled to the any two or more respective ones of the plurality of pre-fabricated panels to form a power busway configured to distribute electrical power from a modular electrical device to rack-mounted computing devices that are supplied cooling air from the plurality of cold aisles.

22. The method of claim 20, further comprising:
providing another set comprising another plurality of pre-fabricated panels at the data center; and
coupling the other set of the other plurality of pre-fabricated panels to another structural frame at the data center,
wherein the other set of the other plurality of pre-fabricated panels coupled to the other structural frame extend the structure of the air plenum, and
wherein power busway segments coupled to any one or more of the other plurality of pre-fabricated panels of the other set of pre-fabricated panels couple together with installed power busway segments to extend a power busway at the data center.

* * * * *